(12) United States Patent
Lynch et al.

(10) Patent No.: US 10,622,037 B2
(45) Date of Patent: Apr. 14, 2020

(54) MEMORY ARRAY WITH REDUCED READ POWER REQUIREMENTS AND INCREASED CAPACITY

(71) Applicant: Purdue Research Foundation, West Lafayette, IN (US)

(72) Inventors: John K. Lynch, West Lafayette, IN (US); Pedro P. Irazoqui, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 16/016,503

(22) Filed: Jun. 22, 2018

(65) Prior Publication Data
US 2018/0301176 A1  Oct. 18, 2018

Related U.S. Application Data

(62) Division of application No. 15/155,905, filed on May 16, 2016, now Pat. No. 10,096,348.

(Continued)

(51) Int. Cl.
*G11C 7/12* (2006.01)
*G11C 7/06* (2006.01)
(Continued)

(52) U.S. Cl.
CPC ............... *G11C 7/12* (2013.01); *G11C 7/065* (2013.01); *G11C 7/08* (2013.01); *G11C 7/106* (2013.01);
(Continued)

(58) Field of Classification Search
CPC ........... G11C 7/12; G11C 7/1051; G11C 7/08; G11C 7/106; G11C 7/065; G11C 7/14;
(Continued)

(56) References Cited

U.S. PATENT DOCUMENTS 8,169,812 B2   5/2012  Lynch
2003/0230733 A1  12/2003  Tanaka
(Continued)

OTHER PUBLICATIONS

Gosh, S. et al., "Parameter variation tolerance and error resiliency: New design paradigm for the nanoscale era," Proc. IEEE, Oct. 2010.
(Continued)

*Primary Examiner* — Sultana Begum
(74) *Attorney, Agent, or Firm* — Maginot, Moore & Beck LLP

(57) ABSTRACT

An electronic memory array includes a plurality of memory domains, a current controller, and a selector device. Each memory domain includes a plurality of bit cells. The current controller includes a current controller output electrically connectable to said plurality of memory domains and is configured to control a bit cell current. The selector device is electrically connected to the current controller and the plurality of memory domains. The selector device is configured to selectively electrically connect the current controller output to only a select one of said memory domains, such that the current controller controls only the bit cell current of the bit cells of the select memory domain.

2 Claims, 19 Drawing Sheets

Related U.S. Application Data

(60) Provisional application No. 62/162,381, filed on May 15, 2015, provisional application No. 62/162,307, filed on May 15, 2015.

(51) Int. Cl.
  *G11C 7/14* (2006.01)
  *G11C 7/08* (2006.01)
  *G11C 7/10* (2006.01)
  *G11C 11/4091* (2006.01)
  *G11C 11/4094* (2006.01)
  *G11C 11/419* (2006.01)
  *G11C 11/56* (2006.01)

(52) U.S. Cl.
  CPC .............. *G11C 7/1051* (2013.01); *G11C 7/14* (2013.01); *G11C 11/4091* (2013.01); *G11C 11/4094* (2013.01); *G11C 11/419* (2013.01); *G11C 11/565* (2013.01)

(58) Field of Classification Search
  CPC . G11C 11/565; G11C 11/419; G11C 11/4094; G11C 11/4091
  See application file for complete search history.

(56) References Cited

U.S. PATENT DOCUMENTS

| | | | |
|---|---|---|---|
| 2007/0171708 A1* | 7/2007 | Tedrow | G11C 11/5642 365/185.03 |
| 2009/0034352 A1 | 2/2009 | Choy | |
| 2010/0315858 A1 | 12/2010 | Lynch | |
| 2011/0160803 A1* | 6/2011 | Stessman | A61N 1/37 607/62 |
| 2014/0036580 A1* | 2/2014 | Yang | G11C 11/413 365/156 |
| 2014/0084912 A1 | 3/2014 | Van Vroonhoven | |
| 2016/0014362 A1 | 1/2016 | Kurokawa | |
| 2016/0172032 A1 | 6/2016 | Matsuoka | |

OTHER PUBLICATIONS

Xiang, Y. et al., "Design of a multilevel DRAM with adjustable cell capacity," Proc. IEEE CCECE, 2001.
Meinerzhagen, P. A. et al., "Design and failure analysis of logic compatible multilevel gain-cell-based DRAM for fault-tolerant VLSI systems," Proc. IEEE/ACM GLSVLSI, 2011.
Gillingham, P., "A sense and restore technique for multilevel DRAM," IEEE TCSII, Jul. 1996.
Amrutur, B. et al., "A replica technique for word line and sense control in low-power SRAM's," IEEE JSSC, Aug. 1998.
Arslan, U. et al, "Variation-tolerant SRAM sense-amplifier timing using configurable replica bitlines," Proc. IEEE CICC, Sep. 2008.
"ITRS," 2009. [Online]. Available: http://www.itrs.net.
Breuer, M., "Let's think analog," Proc. IEEE CSAS on VLSI, May 2005.
Komatsu, S. et al., "A 40-nm low-power SRAM with multi-stage replica bitline technique for reducing timing variation," Proc. IEEE CICC, Sep. 2009.
Cockburn, B. et al., "A multilevel DRAM with hierarchical bitlines and serial sensing," Proc. IEEE MTDT, Jul. 2003.
Khalid, Muhammad Umer, et al., Replica Bit-Line Technique for Embedded Multilevel Gain-Cell DRAM, Telecommunications Circuits Laboratory, EPFL, 2012 IEEE, Lausanne, Switzerland.
Somasekhar, D., et al., A 10 Mbit, 15 GBytes/sec bandwidth 1 T DRAM chip with planar MOS storage capacitor in an unmodified 150 nm logic process for high-densityon-chip memory applications, Proc. ESSCIRC, 2005, pp. 355-358.
Koob, J. C., et al., Design and characterization of a multilevel DRAM, IEEE Trans. VLSI Syst., 2011, pp. 1583-1596, vol. 19, No. 9.
Chun, K. C., et al., A 667 MHz logic-compatible embedded DRAM featuring an asymmetric 2 T gain cell for high speed on-die caches, IEEEJ, Solid-State Circuits, 2012, pp. 547-559, vol. 47, No. 2.
Ichihashi, M., et al., 0.5 V asymmetric three-Tr. Cell (ATC) DRAM using 90 nm generic CMOS logic process, Proc. IEEE Symp. VLSI Circuits, 2005, pp. 366-369.
Lee, Y., et al., A 5.4 nW/kB retention power logic-compatible embedded DRAM with 2 T dual-Vt gain cell for low power sensing applications, Proc. IEEE A-SSCC, 2010.
Kinget, P., Device mismatch and tradeoffs in the design of analog circuits, IEEE J. Solid-State Circuits, 2005, pp. 1212-1224, vol. 40, No. 6.

* cited by examiner

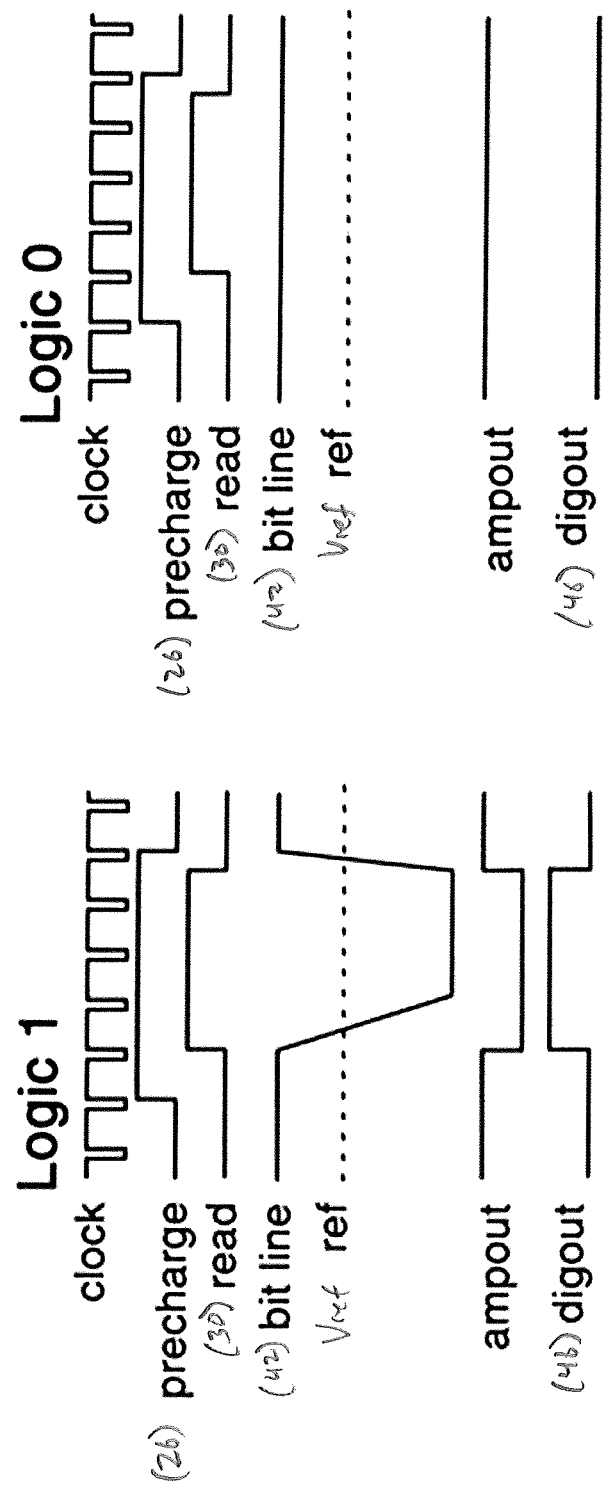

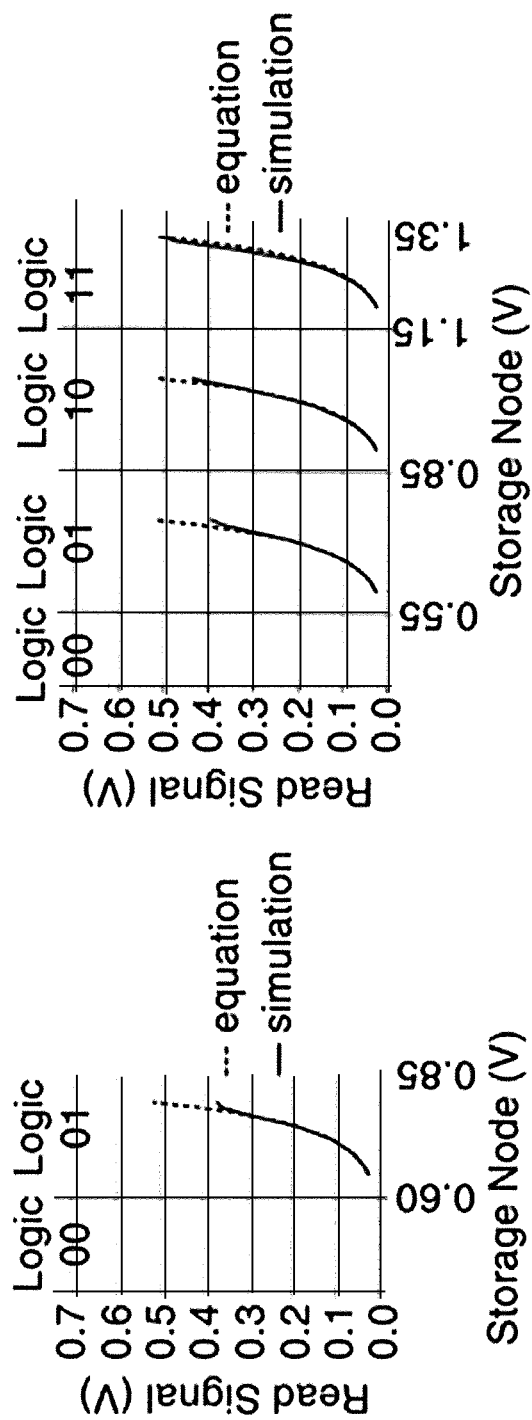

MEMORY ARRAY WITH REDUCED READ POWER REQUIREMENTS AND INCREASED CAPACITY

This application is a divisional application of U.S. application Ser. No. 15/155,905, filed on May 16, 2016, which claims the benefit of priority of U.S. provisional application Ser. No. 62/162,307, filed on May 15, 2015 and U.S. provisional application Ser. No. 62/162,381, filed on May 15, 2015 the disclosures of which are herein incorporated by reference in their entirety.

STATEMENT OF FEDERALLY SPONSORED RESEARCH OR DEVELOPMENT

This invention was made with government support under Contract No. N66001-12-1-4029 awarded by the Defense Advanced Research Projects Agency. The government has certain rights in the invention.

FIELD

This disclosure relates to the field of electronic memory devices and in particular to random access memory arrays.

BACKGROUND

Memory arrays are electronic devices that store digital data. An exemplary type of memory array is a random access memory ("RAM") array typically found in personal computers, smartphones, and the like. There are multiple types of RAM arrays including static RAM ("SRAM") arrays and dynamic RAM ("DRAM") arrays. The data stored by an SRAM array is retrained so long as power is supplied to the memory array, whereas the data stored by a DRAM array typically must be periodically refreshed.

The memory industry is continually seeking to improve the attributes of power consumption, read access time, and memory capacity of all types of memory arrays. The relationship within each attribute and between attributes is complex and each attribute has multiple contributing factors. Power consumption includes the electrical power consumed by the memory array during read cycles, write cycles, restore cycles, as well as the electrical power consumed by the memory array to refresh the stored values. These power consumption attributes in turn are affected by noise sensitivity, retention time, leakage currents, and the threshold voltage of transistors within the memory arrays. Read access time is affected by the rate and amplitude of bit line voltage changes, delay, and required clock cycles. Capacity of the memory array is affected by technology node, architecture (e.g. one transistor (1T), two transistor (2T), three transistor (3T), or six transistor (6T)) and the number of bits stored per cell. In addition, when one memory array attribute is improved, a tradeoff is typically needed with one or more of the other attributes. For example, when power consumption is decreased read access time increases and/or capacity decreases.

Recent approaches in improving memory arrays have (i) reduced the read access time at the expense of capacity, and (ii) increased memory capacity at the expense of power consumption. Both of these approaches also suffer from issues including full-scale signal swings on high capacitance bit lines, a read implementation based on charge sharing, and a destructive read process. The first two issues ultimately cause higher power consumption and the latter issue lengthens read access time.

Therefore, it is desirable to provide a logic-compatible memory architecture that effectively reduces read power requirements of the memory array and increases the capacity of the memory array, while maintaining suitable read access times.

SUMMARY

According to an exemplary embodiment of the disclosure, an electronic memory array includes a plurality of memory domains, a current controller, and a selector device. Each memory domain includes a plurality of bit cells. The current controller includes a current controller output electrically connectable to the plurality of memory domains and is configured to control a bit cell current. The selector device is electrically connected to the current controller and the plurality of memory domains. The selector device is configured to selectively electrically connect the current controller output to only a select one of the memory domains, such that the current controller controls only the bit cell current of the bit cells of the select memory domain.

According to another exemplary embodiment of the disclosure, an electronic memory array includes a plurality of read bit lines, a plurality of bit cells, a plurality of bit line amplifier units, a reference monitor, a plurality of latches, and a controller. Each bit cell has a hold voltage that is electrically connectable to a corresponding read bit line. Each bit line amplifier unit is connected to a corresponding read bit line. The reference monitor has an output that is electrically connectable to each bit line amplifier unit. The reference monitor is configured to monitor a reference voltage. Each latch is electrically connected to one bit line amplifier unit, and each latch is configured to change from a first latch state to a second latch state based on a voltage on the read bit line. The voltage on the read bit line is based on the hold voltage and the reference voltage. The controller is configured to cause the plurality of latches to enter the first latch state at a beginning of a memory array read cycle, and to enable each corresponding bit line amplifier unit to draw electrical current from the reference monitor only during a time period extending from the beginning of the read cycle to a time when the corresponding latch changes to the second latch state.

According to yet another exemplary embodiment of the disclosure, an electronic memory array including a plurality of read bit lines, includes a voltage source and a plurality of bit line amplifier units. The voltage source includes a shared transistor configured to establish a reference voltage. The plurality of bit line amplifier units is electrically connected to the voltage source to receive the reference voltage. Each bit line amplifier unit includes a transistor having a gate that is electrically connected to a corresponding read bit line. Each bit line amplifier unit is further configured to generate an output based on a comparison of the reference voltage and a voltage on the corresponding read bit line. The shared transistor of the voltage source and the corresponding transistor in each bit line amplifier unit are formed in the same circuit die. The threshold voltage of the shared transistor cancels a threshold voltage of each of the corresponding transistors in the bit line amplifier units.

BRIEF DESCRIPTION OF THE FIGURES

The above-described features and advantages, as well as others, should become more readily apparent to those of ordinary skill in the art by reference to the following detailed description and the accompanying figures in which:

FIG. 2A is a graph illustrating a timing diagram for a BASE2 memory read operation of the memory array of FIG. 1B when the stored voltage corresponds to a logic "1;"

FIG. 2B is a graph illustrating a timing diagram for a BASE2 memory read operation of the memory array of FIG. 1B when the stored voltage corresponds to a logic "0;"

FIG. 8A is a graph of read signal voltage verses storage node voltage of an MDP bit cell in BASE2 mode;

FIG. 8B is a graph of read signal voltage verses storage node voltage of an MDP bit cell in BASE4 mode;

DETAILED DESCRIPTION

Figures 1A, 1B:
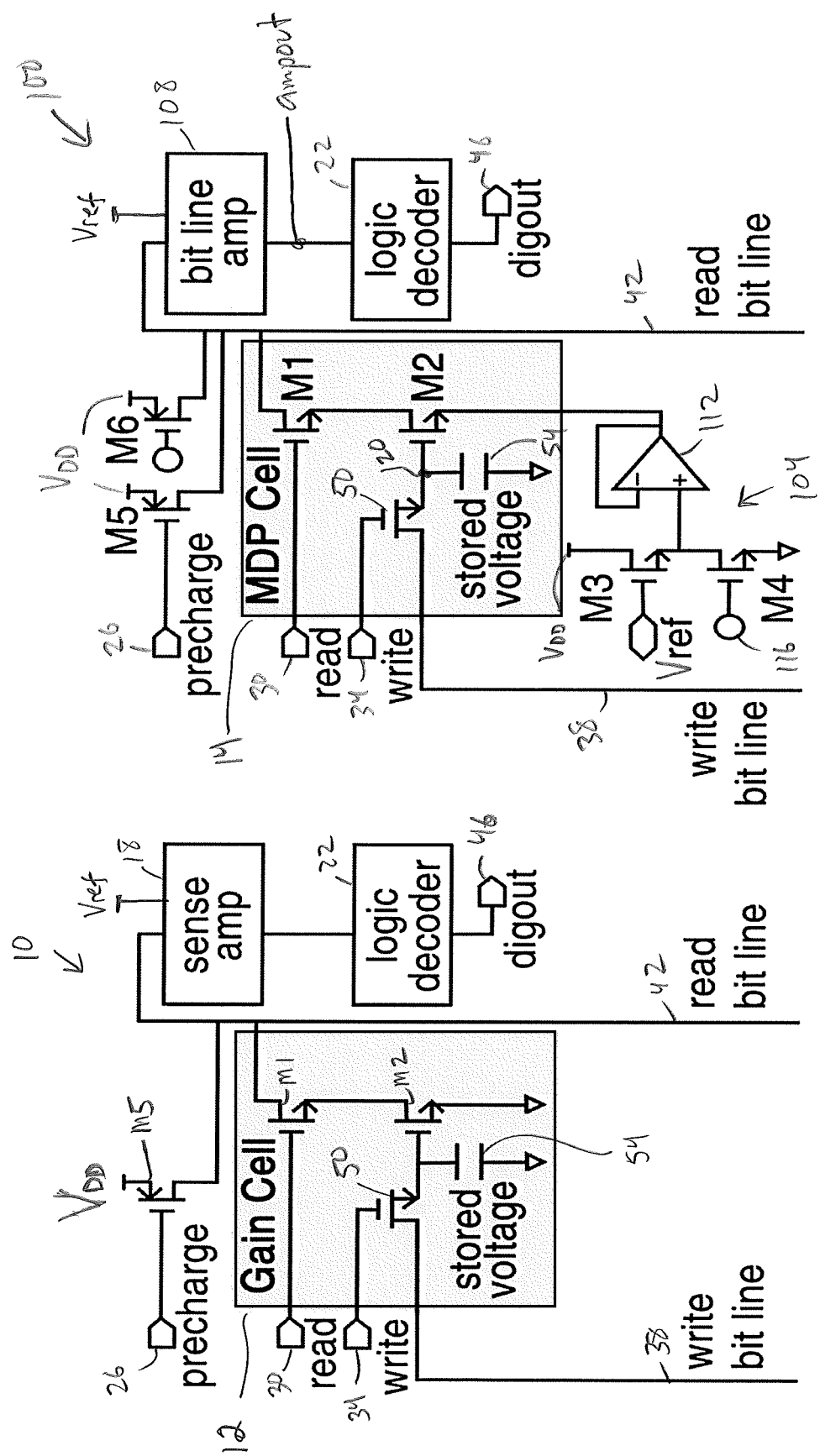
FIG. 1A is a block diagram of a memory array including a 3T gain cell.
FIG. 1B is a block diagram of another memory array that includes gain cells configured as modified differential pair gain cells ("MDP gain cells" or "MDP bit cells"), only one MDP bit cell is shown.

For the purpose of promoting an understanding of the principles of the disclosure, reference will now be made to the embodiments illustrated in the drawings and described in the following written specification. It is understood that no limitation to the scope of the disclosure is thereby intended. It is further understood that this disclosure includes any alterations and modifications to the illustrated embodiments and includes further applications of the principles of the disclosure as would normally occur to one skilled in the art to which this disclosure pertains.

Throughout this description, some aspects are described in terms that would ordinarily be implemented as software programs. Those skilled in the art will readily recognize that the equivalent of such software can also be constructed in hardware, firmware, or microcode. Because data-manipulation algorithms and systems are well known, the present description is directed in particular to algorithms and systems forming part of, or cooperating more directly with, systems and methods described herein. Other aspects of such algorithms and systems, and hardware or software for producing and otherwise processing signals or data involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Various aspects herein relate to an operational amplifier ("op-amp") or other reference voltage source or reference current source used to provide a reference for a memory bit line amplifier, often referred to as a "sense amplifier" or "sense amp," that requires less static power, has superior timing performance, and allows for a global threshold voltage adjustment compared to prior schemes. Various aspects are applicable to either SRAM or DRAM. In various aspects, the static power is reduced in the bit line amplifiers in a memory array, either in SRAM or DRAM. Various aspects permit global adjustment of the amplifier switching threshold, which permits accommodating noise in memory circuitry without degrading performance. Various aspects provide improved timing performance. Various aspects adjust the threshold, improving noise performance. Various aspects reduce static power consumption. Various aspects using op-amps are discussed herein, but all such aspects can be used with other voltage reference sources or current reference sources unless otherwise explicitly noted. Other example reference sources include Zener diodes, bandgap references, low-dropout regulators (LDOs), current mirrors, transconductance amplifiers, transimpedance amplifiers, and benchtop, switching, or other regulated power supplies.

Various aspects herein can be used with an eight-transistor (8T) SRAM. An example 8T SRAM includes a six-transistor (6T) SRAM and two transistors connected (e.g. as an inverter) to buffer data stored in the SRAM to facilitate readout, e.g., over longer or higher capacitance bit lines. In some examples, the sense amps described herein can be used with memory cells using storage capacitors or inverter pairs to retain data.

Memory Array with Multiple Domains of MDP Bit Cells

FIG. 1A depicts a memory array 10 including a plurality of gain cells 12, only one of which is illustrated. The memory array 10 further includes a sense amplifier 18, a logic decoder 22, a precharge signal port 26, a read port 30, a write port 34, a write bit line 38, a read bit line 42, and a digital output port 46. The gain cell 12, which is also referred to herein as a bit cell, is configured to store at least one bit of digital data.

The gain cell 12 includes a transistor M1, a transistor M2, a transistor 50, and a capacitor 54. Transistor M1 has a gate electrically connected to the read port 30, a drain electrically connected to the read bit line 42, and a source electrically connected to the drain of transistor M2. Transistor M2 includes a gate electrically connected to the source of transistor 50 and to the capacitor 54, a source electrically connected to signal ground, and a drain electrically connected to the source of transistor M1. Transistor 50 includes a gate electrically connected to the write port 34, a drain electrically connected to the write bit line 38, and a source electrically connected to the capacitor 54 and to the gate of transistor M2. The capacitor 54 is a storage element of the memory array 10 and is configured to store a bit of digital data as a stored charge/voltage.

The sense amplifier 18 includes an input electrically connected to the read bit line 42, an input electrically connected to a reference voltage source Vref, and an output electrically connected to the logic decoder 22. In one embodiment, the sense amplifier 18 is configured to detect and amplify a small differential in voltage/current between the read bit line 42 and the reference voltage source Vref. The sense amplifier 18 is provided as any desired sense amplifier.

The logic decoder 22 includes an input electrically connected to the output of the sense amplifier 18 and an output electrically connected to the digital output port 46. The logic decoder 22 is configured to receive the amplified differential in voltage/current detected by the sense amplifier 18 and to output a standard digital signal representing the bit of digital data stored by the capacitor 54.

The precharge signal port 26 is connected to the gate of a transistor M5 and is configured to saturate transistor M5 (i.e. turn on) to supply the read bit line 42 with a precharge voltage. Transistor M5 includes a source that is electrically connected to a voltage $V_{DD}$ and a drain that is electrically connected to the read bit line 42.

In use of the memory array 10, read power is caused by voltage transitions on the read bit line 42. Refresh power is caused by voltage transitions on both the read bit line 42 and the write bit line 38. The rate at which the stored charge in the capacitor 54 is refreshed is referred to herein as the "retention time" and controls the refresh power. The retention time is determined from the rate the storage capacitor 54 is discharged by the various leakage currents in the memory array 10.

To write a digital value to the gain cell 12, the read port 30 is deasserted to cutoff transistor M1 (i.e. turn off), and the write port 34 is asserted to saturate transistor 50. Then the write bit line 38 is supplied with a voltage representing the digital value. The voltage supplied to the write bit line 38 is electrically connected to the capacitor 54, which stores a charge based on the magnitude of the supplied voltage. The voltage stored by the capacitor 54 is enough to saturate transistor M2 or to cause transistor M2 to operate in the ohmic mode.

To read the digital value stored in the gain cell 12, first the precharge port 26 is asserted to saturate transistor M5 and to precharge the read bit line 42, which is floating, to the reference voltage Vref. Then the precharge port 26 is deasserted to cutoff transistor M5. Next, the read port 30 is asserted to saturate transistor M1, which forms an electrical path that connects the read bit line 42 to the transistor M2, which is either saturated or operating in the ohmic mode (if a logical 1 is stored in the capacitor 54, for example) or is cutoff (if a logical 0 is stored in the capacitor 54, for example). Depending on the state of transistor M2, the voltage on the read bit line 42 is influenced. Typically, if the capacitor 54 has stored a logical 1, then the voltage on the read bit line 42 is reduced slightly from the level of Vref in response to being electrically connected to the transistor M2. Also, typically, if the capacitor 54 has stored a logical 0, then the voltage on the read bit line 42 does not change (with any significance) from the level of Vref in response to being electrically connected to the transistor M2. The sense amplifier 18 senses and amplifies any changes departing from Vref on the read bit line 42, and the logic decoder 22 outputs an electrical signal represented by the change in voltage (if any) on the read bit line 42 as sensed by the sense amplifier 18.

Compared to a 1T1C memory cell, the gain cell 12 has reduced active power due to smaller voltage transitions. The gain cell 12 has shorter read access times due to nondestructive reads. The gain cell 12 also has reduced noise sensitivity because the read signal is not derived from a charge sharing process. These advantages for the gain cell 12 with respect to the 1T1C memory cell typically come at the expense of reduced capacity. However, the gain cell 12 read signal is a function of the threshold voltage of transistor M2. The threshold voltage variance may result in increased voltage swings on the write bit line 38 to accommodate the largest variance thereby increasing write and refresh power consumed by the gain cell 12.

The memory array 100 of FIG. 1B, includes an architecture configured to remove the effects of within-die threshold voltage, as exhibited by the memory array 10, by including a current controller 104 that forms an MDP bit cell 14. The memory array 100 includes many of the same components of the memory array 10 (as shown by the components of FIG. 1B having the same references as FIG. 1A). The memory array 100 includes a bit cell 14, an additional transistor M6 having a drain electrically connected to the read bit line 42 and a source electrically connected to $V_{DD}$, the current controller 104, and a bit line amplifier 108.

The MDP bit cell 14 is essentially the same as the bit cell 12, except that the source of transistor M2 is electrically connected to an output of the current controller 104, as described within, instead of circuit ground.

The current controller 104 includes transistor M3, transistor M4, and operational amplifier 112. The transistor M3 includes a drain electrically connected to voltage $V_{DD}$, a gate electrically connected to the reference voltage Vref, and a source electrically connected to the non-inverting input of the operation amplifier 112 and the drain of the transistor M4. The transistor M4 includes a drain electrically connected to the source of transistor M3 and to the non-inverting input of the operational amplifier 112, and a source electrically connected to circuit ground. The gate of transistor M4 is connected to port 116. In one embodiment, the transistors M1, M2, M3, and M4 are all formed on the same circuit die. In another embodiment, transistors M1, M2, M3, M4, M5, and M7, bit line amplifier 108, and op amp 112 are all formed on the same circuit die.

The current controller 104 is configured to supply an electrical current to the read bit line 42 and/or to receive electrical current from the read bit line 42. Thus, the current controller 104 is configured to influence and control a current on the read bit line 42, which is also referred to herein as a bit cell current. The bit cell current, therefore, is influenced by at least the precharge voltage, the transistor M1, the transistor M2, the magnitude of the voltage at the hold node 120, and the current controller 104. Since the current controller 104 influences the bit cell current, the controller 104 also influences and establishes a voltage on the read bit line 42, which is referred to herein as a bit cell voltage. The bit cell voltage is sensed by the bit line amplifier 108.

The magnitude of the current supplied to the read bit line 42 by the current controller 104 is determined by at least the magnitude of the voltage stored by the capacitor 54 at the hold node 120, which controls the state of transistor M2 (saturated, cutoff, or ohmic). The current supplied by the current controller 104 influences the floating voltage on the read bit line 42, which has been precharged to a precharge voltage level at the beginning of a read operation.

The operational amplifier 112 (also referred to herein as op amp 112) is configured in unity gain mode in which the output of the op amp 112 is electrically connected to the inverting input of the op amp 112. Accordingly, in the unity gain mode the op amp 112 exhibits a gain of one and is suited for operating as a voltage source that does not draw any significant current from the transistors M3 and M4. The op amp 112 amplifies any voltage difference between the non-inverting input and the inverting input. Thus, the configuration is also referred to as an op amp voltage follower, since the unity gain configuration forces the op amp 112 to adjust the voltage at the output to equal the voltage at the non-inverting input. An advantage of using the op amp 112 as a voltage source is that one op amp 112 can supply voltage and current to a plurality of the bit cells 14. Thus, the output of the op amp 112, in some embodiments, may be electrically connected to up to thousands of other bit cells 14. (See FIG. 6).

The bit line amplifier 108, in one embodiment, is a differential amplifier configured to sense and amplify a difference in voltage between the reference voltage Vref and the voltage on the read bit line 42 during a read operation of the memory array 100. The output of the bit line amplifier 108 is a standard digital logic value. In some embodiments, the memory array 100 may include the sense amplifier 18 instead of the bit line amplifier 108.

The logic decoder 22 is configured to sample the output of the bit line amplifier 108 and based on the results of the sampling, the logic decoder 22 outputs a digital value that represents the digital data stored by the hold voltage of the capacitor 54.

As noted above, in the gain cell 12 of FIG. 1A, die-to-die read bit line voltage variance is caused by within-die threshold voltages and negatively affects the behavior of the current on the read bit line 42. The configuration of the current controller 104 and the bit cell 14 in the memory array 100 removes the effects of within-die threshold voltage by adding transistor M3. In the memory array 100, transistor M3 forms a differential pair construct with transistor M2 of the bit cell 14. Moreover, in one embodiment, the transistors M2 and M3 form a modified differential pair ("MDP") with the op amp 112. In such an embodiment, the bit cell 14 of FIG. 1B is referred to as an MDP bit cell 14. Operational amplifier 112 supplies voltage/current allowing multiple bit cells 14 to share the M3 reference transistor during a read operation of the bit cells 14. Since the within-die threshold voltage of the two transistors M2 and M3, are effectively equal within a specified tolerance, they cancel each other out. In one embodiment, the cancelation of threshold voltages of transistors M2 and M3, refers to the threshold voltage of the transistors M2 and M3 being equal in magnitude and opposite in polarity, according to at least one reference point. Thus, the within-die threshold voltages sum to zero within a specified tolerance. Consequently, the problem of die-to-die bit line voltage variance is removed and the predictability of the bit cell current is greatly improved as compared to a memory array 10 including the gain cell 12.

With reference to the timing diagrams of FIGS. 2A and 2B, when the memory array 100 is operated in BASE2 mode the stored voltage in the capacitor 54 is one of two possible values, typically 0.5V or 0.8V. Before the read process starts, transistor M5 pre-charges the read bit line 42. At the start of the read process, the precharge input 26 is deasserted to cutoff transistor M5 and shortly after the read input 30 is asserted. The voltage on the read bit line 42 is then controlled with a current that is a function of the difference between the stored voltage in the capacitor 54 and the reference voltage Vref. If the stored voltage is less than the reference voltage Vref, the read bit line 42 voltage will change no more than the value of the saturation voltage of transistor M6. But if the stored voltage is greater than the reference voltage Vref, the read bit line 42 will be pulled down by the current in the storage transistor M2 until the topological limit is reached. The bit line amplifier 108 operates as a comparator and uses an appropriately low switching voltage to detect any change in voltage on the read bit line 42, and in doing so, discerns the value represented by the voltage on the storage node 120.

The MDP memory array 100, with transistors M1, M2, and 50 and shared reference transistor M3, has approximately double the storage capacity of the standard gain cell 12. Specifically, the gain cell 12 is only usable in BASE2 mode. However, the MDP memory array 100 is configured for multi-bit mode in which multiple logical bits are stored in one bit cell 14. In one implementation, one of four logical values is stored in the bit cell 14 and is referred to as BASE4 mode. The modified differential pair construct (transistors M2, M3, op amp 112) of the bit cell 14 enables BASE4 mode, by eliminating the impact of the unpredictable threshold voltage variance on the MDP bit cell 14 voltage, and subsequently on the current controlling the read bit line 42. The insensitivity of the memory array 100 to threshold voltage variance enables smaller voltage intervals between logic values and allows the bit cell 14 of the memory array 100 to reliably accommodate four logical values.

As shown in FIGS. 3A, 3B, 3C, and 3D, the read operation of the MDP bit cell 14 in BASE4 mode is similar to the read operation of the MDP bit cell 14 in BASE2 mode. In BASE4 mode, instead of comparing the voltage of the storage node 120 to a single reference value (Vref), the voltage of the storage node 120 is compared to three reference values 124, 128, 132 (FIG. 3A) one at a time and one after another in a sequential order causing the read bit line 42 to respond accordingly. At the point in the sequence of comparisons that the voltage on the read bit line 42 drops below the reference voltage Vref, the bit line amplifier 108 senses the value stored on the storage node 120. Specifically, the bit line amplifier 108 acts as a comparator and outputs (ampout) a digital indicator to the logic decoder 22. The logic decoder 22 uses the indicator, specifically the point in the sequence of comparisons that the indicator is asserted, to discern the digital value represented by the voltage on the storage node. Exemplary digital values that may be stored as a single voltage in the bit cell 100 include "00," "01," "10," and "11." The digital values are arbitrarily assigned to the values 124, 128, and 132.

Figure 4:
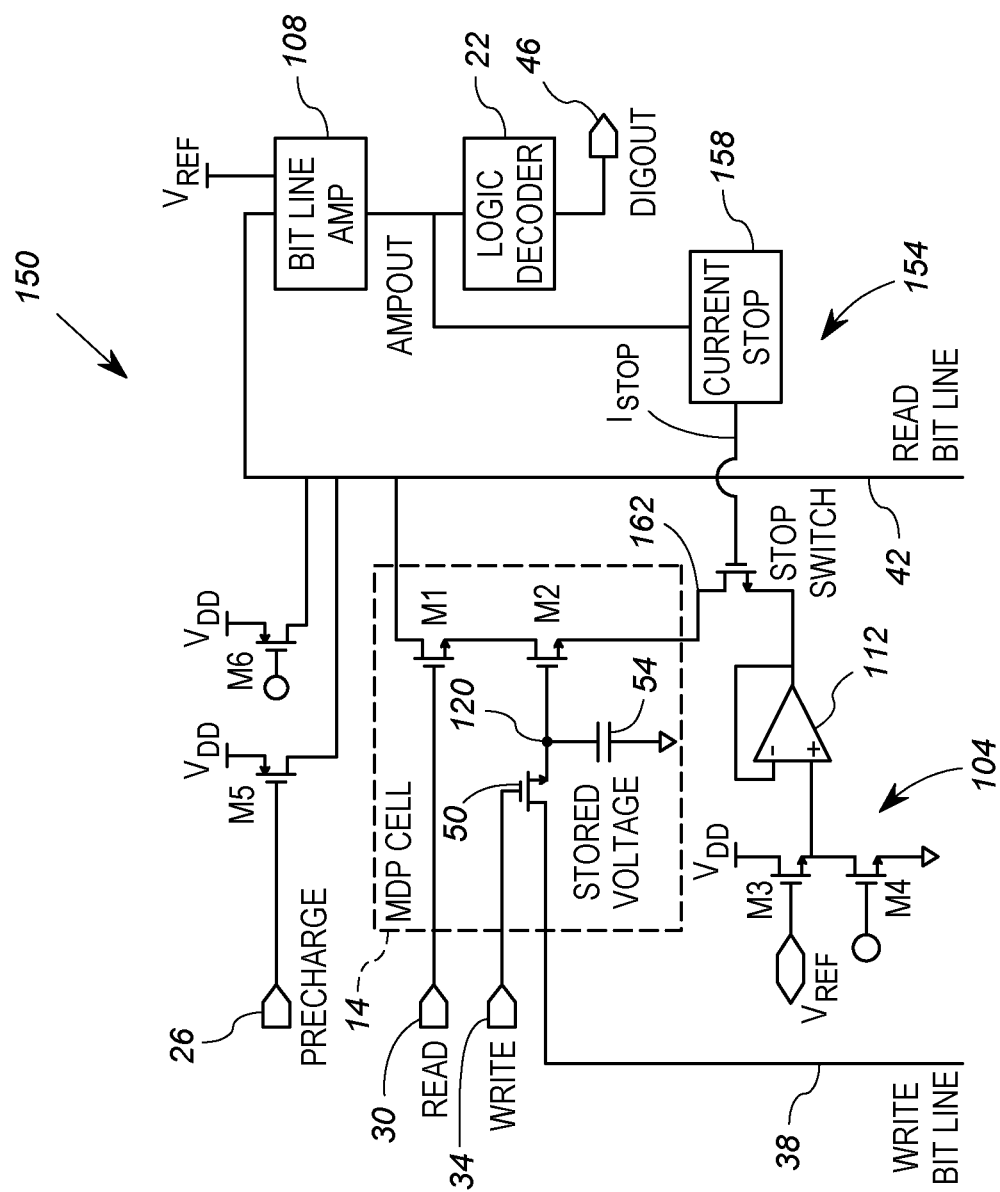
FIG. 4 is a block diagram of another memory array including a plurality of MDP bit cells (only one of which is shown), a current controller, and a current stop assembly.
Figure 5A:
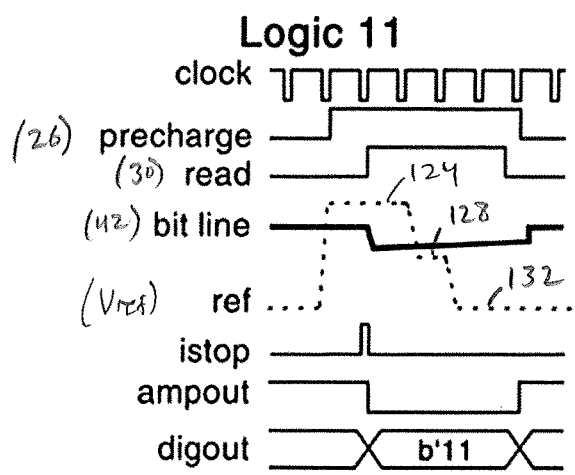
FIG. 5A is a graph illustrating a timing diagram for a BASE4 memory read operation of the memory array of FIG. 4 in multi-bit mode when the stored voltage corresponds to a logic "11;"
Figure 5B:
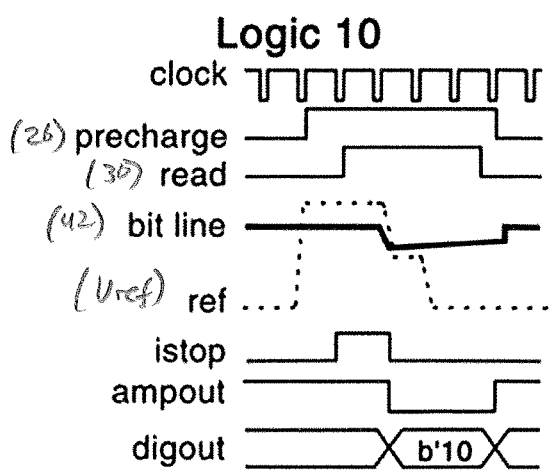
FIG. 5B is a graph illustrating a timing diagram for a BASE4 memory read operation of the memory array of FIG. 4 in multi-bit mode when the stored voltage corresponds to a logic "10;"
Figure 5C:
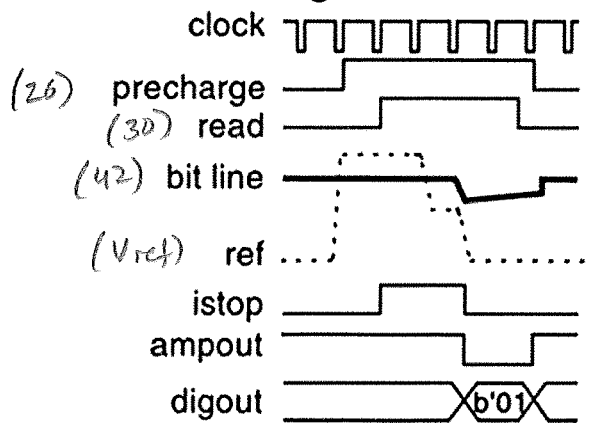
FIG. 5C is a graph illustrating a timing diagram for a BASE4 memory read operation of the memory array of FIG. 4 in multi-bit mode when the stored voltage corresponds to a logic "01;"
Figure 5D:
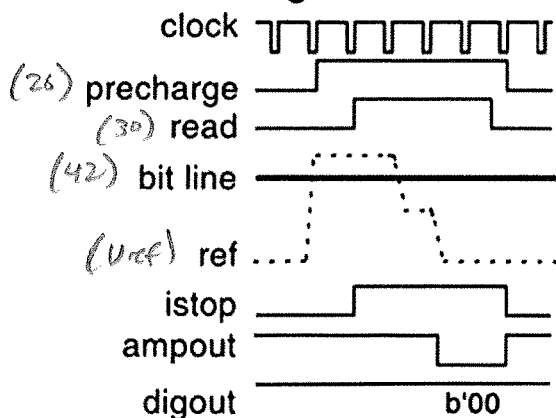
FIG. 5D is a graph illustrating a timing diagram for a BASE4 memory read operation of the memory array of FIG. 4 in multi-bit mode when the stored voltage corresponds to a logic "00;"

As shown in FIG. 4, a memory array 150 includes an architecture that is configured to reduce the electrical current and electrical power that is consumed by the bit cell 14 during a read operation. The memory array 150 includes many of the same components as the memory array 100 (as shown by the components of FIG. 4 having the same references as FIG. 1B). In addition, the memory array 150 includes a current stop assembly 154 having a current stop sense unit 158 and stop switch 162.

The current stop sense unit 158 includes an input that is electrically connected to the output of the bit line amplifier 108 (ampout) and an output (istop) that is electrically connected to the stop switch 162. The stop switch 162, which is shown as a transistor and is also referred to herein as transistor 162, includes a gate that is electrically connected to the output of the current stop sense unit 158, a drain that is electrically connected to the source of transistor M2, and a source that is electrically connected to the output of the op amp 112 (i.e. the output of the current controller 104).

In operation, the current stop assembly 154 stops the bit cell 14 from drawing current from the op amp 112 after the bit line amplifier 108 senses that the voltage on the read bit line 42 is less than the reference voltage Vref. Specifically, during the read operation, the current stop sense unit 158 asserts the gate of the transistor 162 in order to saturate the transistor 162 and to allow the bit cell 14 to draw current from the op amp 112. When the current stop sense unit 158 senses that the output of the bit line amplifier 108 (ampout) has been asserted (indicating that the bit line amplifier 108 has output the standard digital logic value), then the current stop sense unit 158 deasserts the gate of the transistor 162 to cutoff the transistor 162 and to prevent current flow from the output of the op amp 112. Thus, the stop switch 162 is a switch configured to disconnect op amp 112 from transistor M2, thereby terminating control of the read bit line 42 by transistor M3. The current stop assembly 154 reduces the current that is drawn from the op amp 112 during a read operation, and makes the memory array 150 more energy efficient. Moreover, the voltage transitions on the high capacitance read bit lines 42 is drastically reduced because the signal on the read bit line 42 changes only enough to be sensed reliably. Power is correspondingly reduced for all reads of the memory array 150. Additionally, the current stop assembly 154 reduces read access time of the memory array 150.

Furthermore, the stored data content (i.e. the determination of the digital value represented by the voltage on the storage node 120) is contained in the movement of the read bit line 42 away from its clamped value to a value greater than the switching voltage level of the bit line amplifier 108. As such, any movement in the read bit line 42 beyond the switching level of the bit line amplifier 108 typically results in unwanted power draw from the op amp 112. Therefore, it is advantageous to stop the current draw from the op amp 112 at a point after the voltage change is deemed significant and before the inherent limit due to the circuit topology is reached.

FIGS. 5A, 5B, 5C, and 5D display timing diagrams in BASE4 mode using the memory array 150 including the current stop assembly 154. The timing diagrams show that the magnitude of the voltage transition on the read bit line 42 is substantially smaller than the timing diagrams in FIGS. 3A, 3B, 3C, and 3D without current stop assembly 154, thereby illustrating how the memory array 150 saves electrical power.

Figure 6:
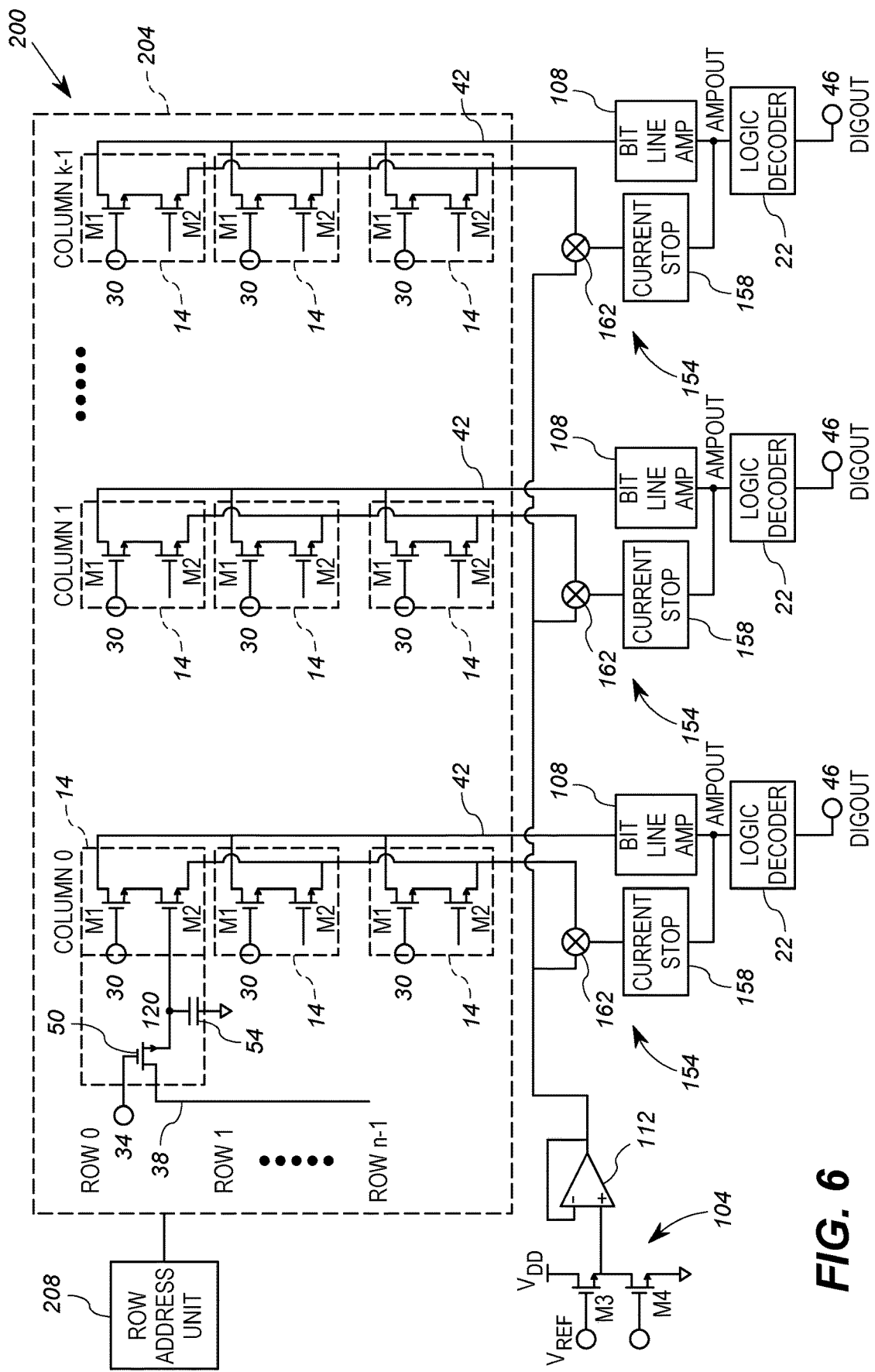
FIG. 6 is a block diagram of a memory array including a memory domain, a current controller, and a current stop assembly, the memory domain includes a plurality of MDP bit cells arranged in a plurality of rows and columns.

As shown in FIG. 6, an electronic memory array 200 includes at least one memory domain 204, a row address unit 208, the current controller 104, a plurality of the bit line amplifiers 108, a plurality of the logic decoders 22, and a plurality of the current stop assemblies 154. The memory domain 204 includes a plurality of the gain cells 14 each of which is configured to store at least one bit of digital data in a corresponding one of the capacitors 54. The capacitor 54 and the transistor 50 are shown for only one of the gain cells 14; however, each gain cell 14 of the memory domain 204 is identical (or substantially identical) and includes a corresponding capacitor 54 and transistor 50. The gain cells 14 of the memory domain 204 are organized in a plurality of columns 0, 1, k–1 and a plurality of rows 0, 1, n–1. In some embodiments, exactly one row is read or written at a time, as selected by the row address unit 208. The circled "X" symbol 162 represents the stop switch 162 shown in FIG. 4. In one embodiment, the gain cells 14 of a particular column share a common write bit line 38 and a common read bit line 42. The row address unit 208 is electrically connected to the plurality of gain cells 14 and is configured to electrically connect selected gain cells 14 to the common write bit line for writing data to the memory array 200 or the common read bit line 42 for reading data from the memory array 200. Each column of gain cells 14 includes a corresponding current stop assembly 154, bit line amplifier 108, and logic decoder 22.

The memory array 200 of FIG. 6, illustrates that a single current controller 104 is configured to operate a plurality of gain cells 14. In one embodiment, data is read from and written to the memory domain 204 one row of gain cells 14 at a time. In such an embodiment, the one op amp 112 of the current controller 104 is configured to supply voltage/current to each gain cell 14 in a select row of the gain cells 14. The memory array 200 of FIG. 6, also illustrates that a single current stop assembly 154, a single bit line amplifier 108, and a single logic decoder 22 are configured to control (i.e. read from and write to) all of the gain cells 14 in a particular column of gain cells 14.

Figure 7A:
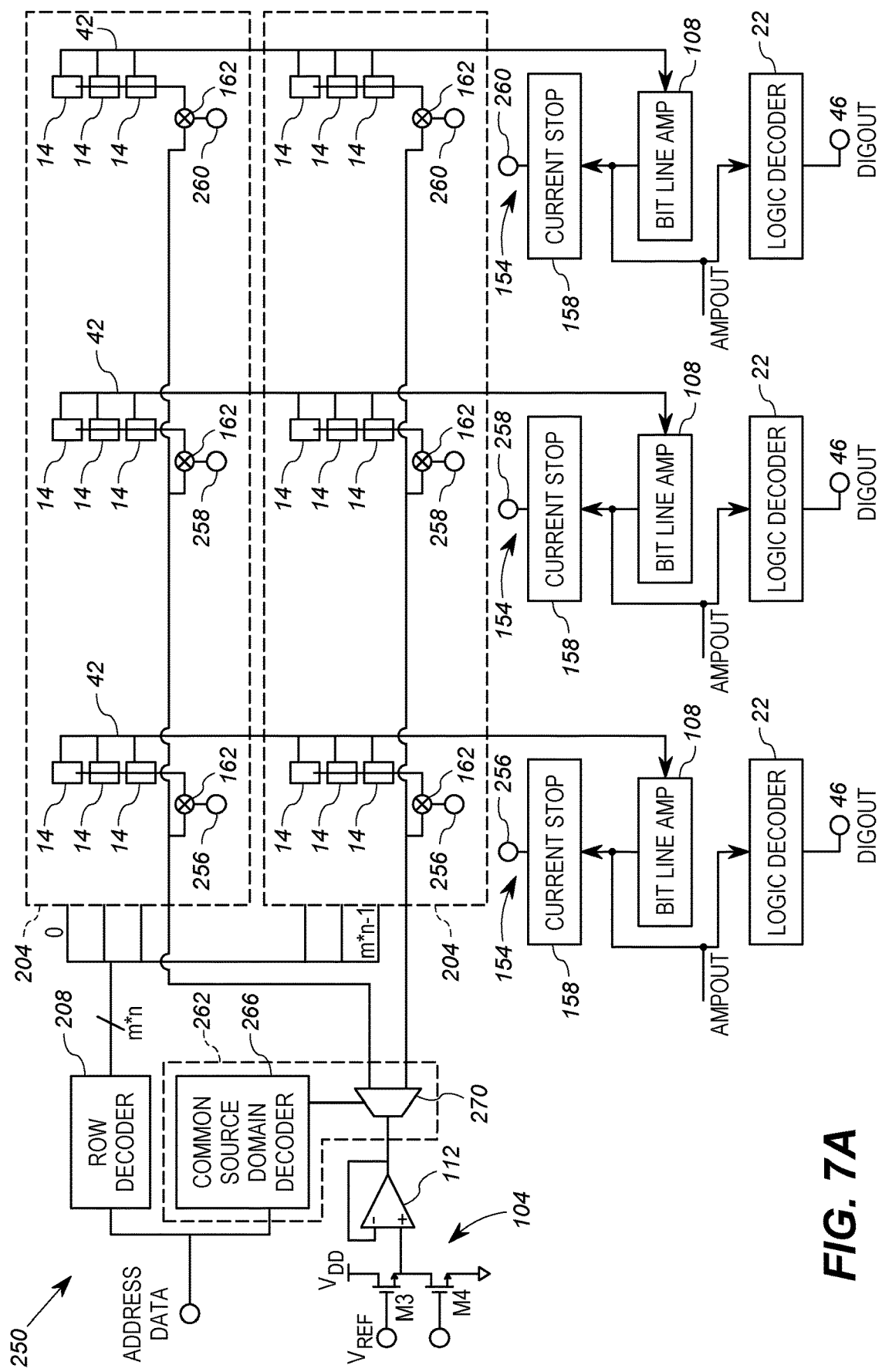
FIG. 7A is a block diagram of a memory array including a plurality of the memory domains of FIG. 6, a current controller, a selector device, and a current stop assembly.

As shown in FIG. 7A, another memory array 250 includes a plurality of the memory domains 204 of FIG. 6, the row decoder 208, and a selector device 262. Two of the memory domains 204 are shown in FIG. 6; however, the memory array 250 may include any desired number of the memory domains 204. The bit cells 14 of the memory domains 204 are provided as any desired type of cell configured to store at least one bit of digital data.

The row address unit 208 includes an input that is configured to receive address data representative of a desired memory domain 204 and a desired row of bit cells 14 within the desired memory domain 204. The row address unit 208 includes a plurality of outputs that, in one embodiment, are connected to each row of bit cells 14 in each memory domain 204. The row address unit 208 is configured to activate a select row of bit cells 14 in a select memory domain 204 to be read from or written to. In one embodiment, the row decoder 208 activates a selected row of bit cells 14 by asserting the appropriate output(s) of the row decoder.

The selector device 262 is electrically connected to the output of the current controller 104 and is configured to receive the address data. The selector device 262 includes a domain decoder 266 and a selector unit 270. The domain decoder 266 includes an input electrically connected to the address data and an output electrically connected to the selector unit 270. The domain decoder 266 is configured to process the address data and to generate an electrical output that is representative of a desired memory domain 204 based on the processed address data.

The selector unit 270 of the selector device 262 includes an address input electrically connected to the domain decoder 266, a signal input electrically connected to the output of the op amp 112 of the current controller 104, and a plurality of signal outputs each electrically connected to a corresponding one of the memory domains 204. The selector unit 270 is configured to electrically connect the output of the current controller 104 to a desired one of the memory domains 204 based on the processed address data. That is, the selector unit 270 enables only a selected one of the memory domains 204 to draw current from the op amp 112 of the current controller 104. The particular selected memory domain 204 is determined by processing the address data. In one embodiment, each memory domain 204 has a unique address.

As shown in FIG. 7A, the selector unit 270 is provided as a 1-n demultiplexer, where "n" equals the number of memory domains 204. Each output of the selector unit 270 is electrically connected to a plurality of stop switches 162 of a corresponding one of the memory domains 204, in a manner identical to the output of the op amp 112 in FIG. 6. The memory array 250 efficiently utilizes electrical power by drawing electrical current from the current controller 104 with only one of the memory domains 204 at a time. Each memory domain 204 is electrically connected to a plurality of current stop assemblies 154, bit line amplifiers 108, and logic decoders 22 in same manner as shown in FIG. 6. The points 256 are common electrical points, the points 258 are common electrical points, and the points 260 are common electrical points.

The demux 270 passes the op-amp 112 voltage to the currently-active domain 204 for readout. In a multidomain chip 250, one row per domain 204 can be read at a time, or one row per chip 250 at a time. Various examples are used in systems using partitioned bit lines, e.g., a top half and a bottom half. For example, an op-amp 112 or set of op-amps 112 can be used for each of two halves of an array 250, with each domain 204 including, for example, 250,000 bit cells 14 of BASE4 storage, for a total of 1 Mbit of memory.

Using multiple domains 204 permits including more bit cells 14 in an array 250 than prior schemes that do not use multiple domains 204, because the array 250 is not limited by the effects of capacitance on the current controller 104. For example, the op-amp 112 drives the capacitance on the sources of the M2 transistors of each bit cell 14 and on the electrical line tying those sources together. The nearest bit cell 14 to the op amp 112 and the farthest bit cell 14 from the op amp 112 have different capacitances because of the respective lengths of the electrical lines and the numbers of sources therebetween. For any given technology and op-amp design, there is a maximum capacitance that the op-amp can drive and still meet timing requirements, thereby limiting the size of known memory arrays that do not include the domains 204 disclosed herein. The domains 204 are physically smaller than the full memory array 250, with the result that the op amp 112 is not limited by the capacitance of any of the bit cells 14, any of the lines, or any other component of the memory array. Thus, organizing the memory array 250 into domains 204 permits expanding the array 250 (by adding additional domains 204) without being limited by the performance of a single op-amp 112. In addition, the memory array 250 provides technical effects including faster readout of the stored bits, the ability to store more than one bit of information in a bit cell 14, and reduced power consumption of the bit line amplifiers 108.

Figure 7B:
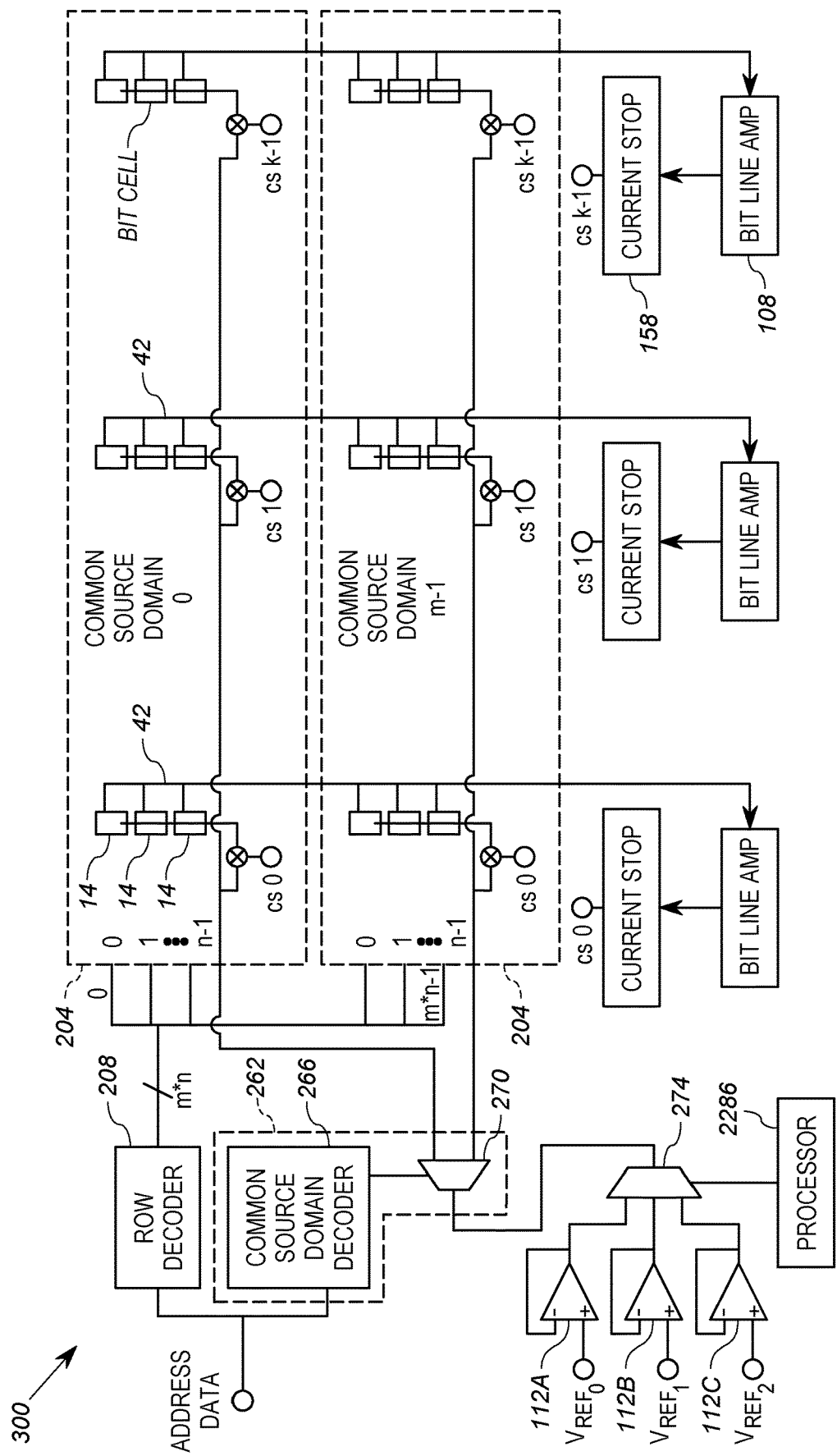
FIG. 7B is a block diagram of a memory array including a plurality of the memory domains of FIG. 6, a current controller, a selector device, and a current stop assembly.

As shown in FIG. 7B, a memory array 300 that is substantially the same as the memory array 250 is configured for BASE4 mode operation. The memory array 300 includes op amp 112A, op amp 112B, op amp 112C, each of which includes an output that is electrically connected to inputs of a multiplexer 274. The multiplexer 274 includes an output that is electrically connected to the input of the selector unit 270 and an address input that is electrically connected to processor 2286. Each op amp 112A, 112B, 112C is configured to output a different magnitude of reference voltage. In one embodiment, the op amps 112A, 112B, 112C output voltages corresponding to the values 124, 128, and 132 shown in FIG. 3A. The processor 2286 is configured to sequentially connect the outputs of the op amps 112A, 112B, 112C to the selector unit 270 in a manner suitable for BASE4 mode of operation.

Figure 3A:
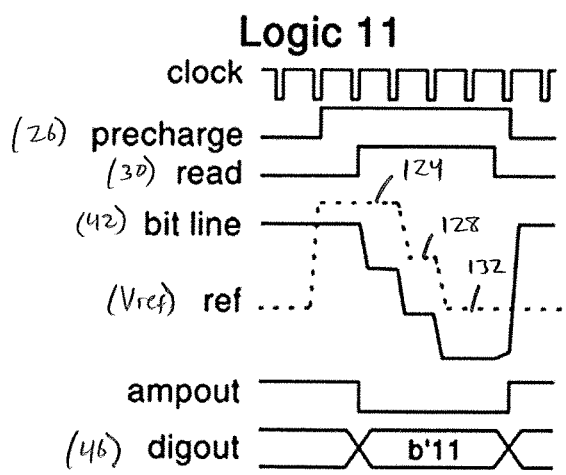
FIG. 3A is a graph illustrating a timing diagram for a BASE4 memory read operation of the memory array of FIG. 1B in multi-bit mode when the stored voltage corresponds to a logic "11;"
Figure 3B:
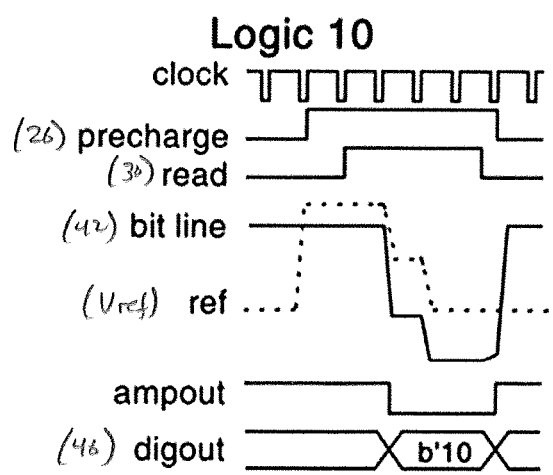
FIG. 3B is a graph illustrating a timing diagram for a BASE4 memory read operation of the memory array of FIG. 1B in multi-bit mode when the stored voltage corresponds to a logic "10;"
Figure 3C:
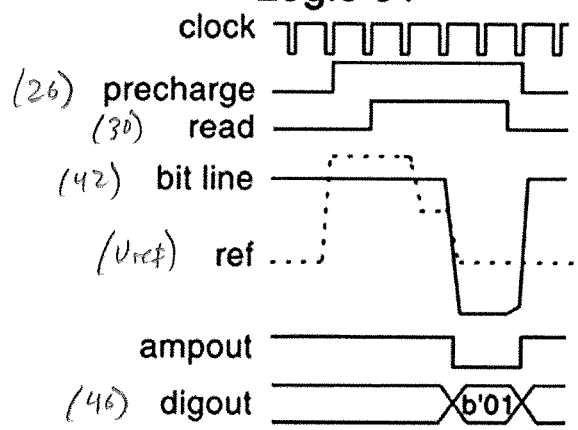
FIG. 3C is a graph illustrating a timing diagram for a BASE4 memory read operation of the memory array of FIG. 1B in multi-bit mode when the stored voltage corresponds to a logic "01;"
Figure 3D:
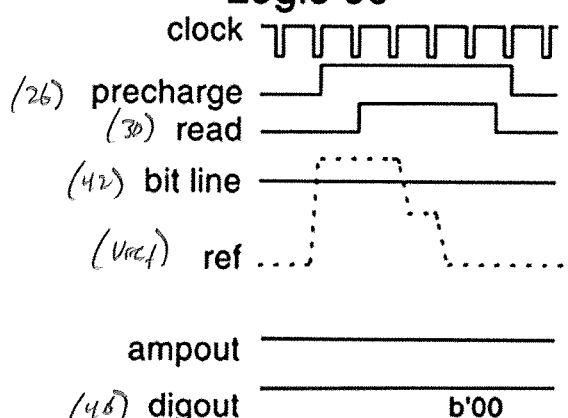
FIG. 3D is a graph illustrating a timing diagram for a BASE4 memory read operation of the memory array of FIG. 1B in multi-bit mode when the stored voltage corresponds to a logic "00;"

In another BASE4 mode of operation, the single op-amp 112 of FIG. 7A is sequentially adjusted to three different voltage levels, such as values 124, 128, and 132 of FIG. 3A. Typically, however, the multiple op amp 112 arrangement of FIG. 7B improves readout time, because the arrangement of FIG. 7B is not limited by the time required for an op-amp to slew between different output voltage levels. An exemplary memory array 250 with just one op amp 112 in the current controller 104 has a read time <10 kHz in BASE4 mode of operation. Some aspects have similar readout time to one-transistor (1T) cells. In various aspects of the arrays 250, 300, since the bit line amplifier 108 can be kept active while waiting for the state of the read bit line 42 to change or not, the timing performance can be superior to prior art memory sense amplifiers. Also, since the actual event triggers the resulting action, the memory arrays 250, 300 disclosed herein provide superior performance over prior art schemes in which a separate event is established from a dummy timing generator to trigger the bit line amplifier.

Memory Array with Bit Line Amplifier Assembly

Figure 15:
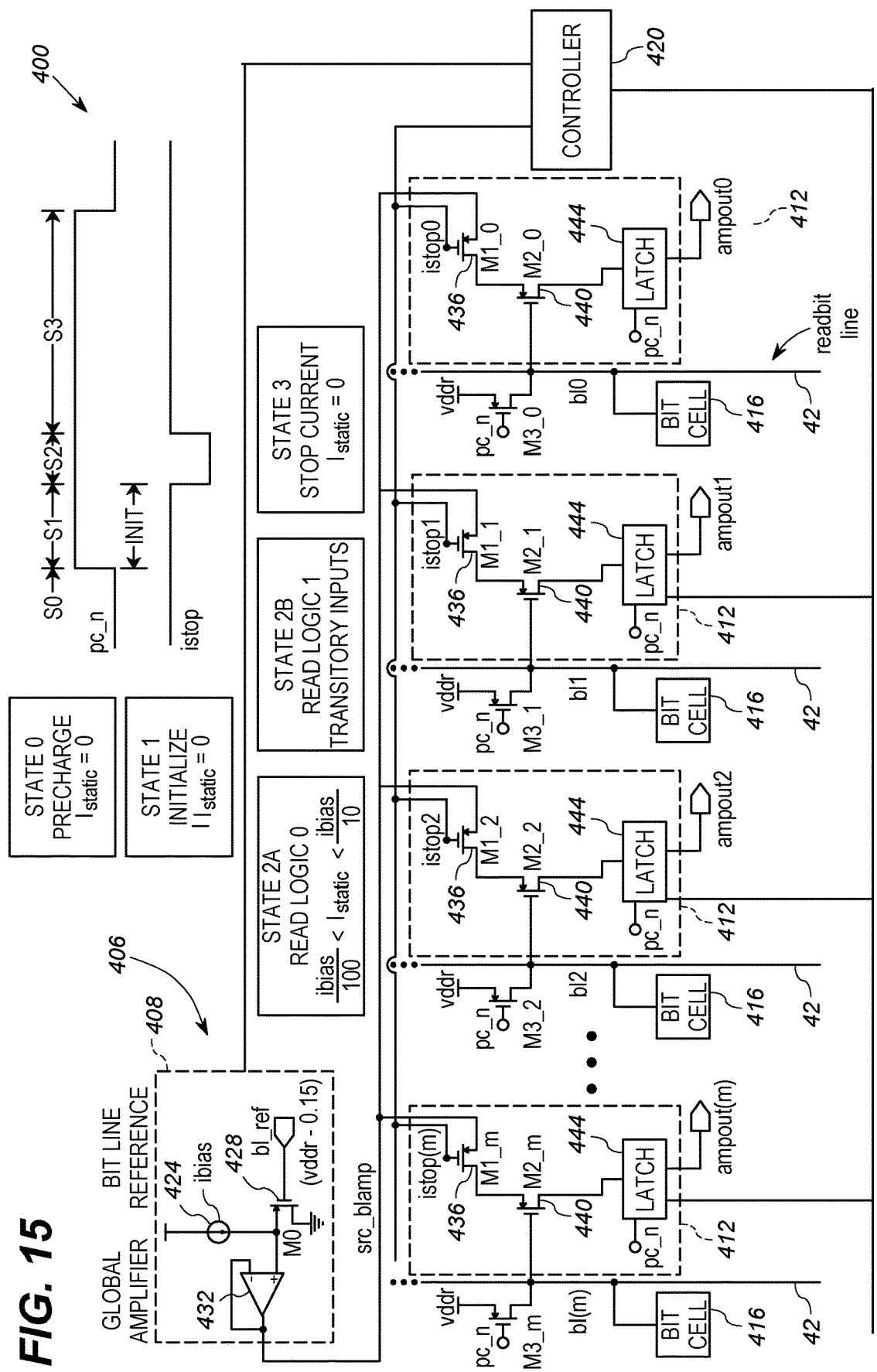
FIG. 15 is an exemplary schematic for a memory array including a bit line amplifier assembly.

As shown in FIG. 15, a memory array 400 includes a plurality of read bit lines 42, a global bit line amplifier assembly 406, a plurality of bit cells 416, and a controller 420. The global bit line amplifier assembly 406 includes a global voltage source 408 and a plurality of bit line amplifier units 412. The global voltage source 408, which is also referred to herein as a global reference monitor, includes a current source 424, a shared transistor 428, and an operational amplifier referred to as op amp 432. The current source 424 is electrically connected to the op amp 432 and to the shared transistor 428. In particular, the current source 424 supplies electrical current to the source of the shared transistor 428 and to the non-inverting input of the op amp 432. The drain of the shared transistor 428, which is also referred to herein as a global transistor, is electrically connected to circuit ground and the gate is electrically connected to a bit line amplifier reference voltage (bl_ref). The output of the op amp 432 (src_blamp) is electrically connected to the inverting input of the op amp 432 and is also electrically connected to each bit line amplifier unit 412. The global voltage source 408 is configured to supply a global reference voltage to each of the bit line amplifier units 412. The shared transistor 428 establishes the global reference voltage/current. In one embodiment, a current with value ibias is generated by the current source 424 and is flowing in transistor 428. An example value for this current is 100 nA. An example voltage value of vddr is 0.9 V. In one embodiment, the global reference source 408 remains active continually through a read operation and is selectively connected to the bit cell amplifier units 412.

The bit cells 416 are provided as any desired type of bit cell that is configured to store at least one bit of digital data as a hold voltage that is electrically connectable to one of the read bit lines 42. The bit cells 416 may be provided as the gain cell 12, the bit cell 14, or any other SRAM or DRAM bit cell including 6T bit cells.

With reference to FIG. 15, the bit line amplifier units 412 are each electrically connected to the output of the global voltage source 408 to receive the global reference voltage. The bit line amplifier units 412 each include a current stop transistor 436, a transistor 440, and a latch 444. The gate of the transistor 436 is electrically connected to the controller 420, the source of the transistor 436 is electrically connected to the output of the global voltage source 408 to receive the global reference voltage, the drain of the transistor 436 is electrically connected to the source of the transistor 440. The gate of the transistor 440 is directly electrically connected to the read bit line 42 and the drain of the transistor 440 is electrically connected to the latch 444. In one embodiment, the shared transistor 428, the transistor 436, and the transistor 440 are formed in the same circuit die. That is, the transistors 428, 436, 440 are each formed on/within the same physical substrate. Accordingly, due to the electrical connection of the transistors 428 and 440, a threshold voltage of the transistor 428 cancels a threshold voltage of the transistor 440. The cancelation of threshold voltages refers to the threshold voltage of the transistor 428 being equal in magnitude and opposite in polarity of the threshold voltage of the transistor 440, according to at least one reference point. Moreover, due to this configuration the op amp 432, the shared transistor 428, and each transistor 440 form a modified differential pair ("MDP"). In a differential pair of transistors, the pair of transistors have the same current flowing between the source and the drain (i.e. flowing through the transistor). In the modified differential pair, the same magnitude of current flows through (i.e. between the source and the drain) each transistor 440 as flows through (i.e. between the source and the drain) the transistors 428. The pair is referred to as "modified" because the current flowing through the transistors 440 is supplied by the op amp 432 and controlled by the transistor 428. The current flowing through the shared transistor 428 is supplied by the current source 424. Thus, the embodiment of the memory array 400 of FIG. 15 including the global bit line amplifier assembly 406 applies the MDP construct to a bit line amplifier in order to develop a stable monitoring process of the read bit lines 42 that is unaffected by variations in threshold voltage levels of the transistors 428 and 440. Accordingly, at least when the transistors 428 and 440 are formed on the same circuit die the threshold voltages of the transistors 428 and 440 cancel each other out.

In another embodiment, the electrical current flowing through the shared transistor 428 establishes, at least in part, the magnitude of the global reference voltage, and an electrical current flows through each transistor 440. The magnitude of the electrical current flowing through each of the transistors 428 is equal to a function of the difference between the global reference voltage and the voltage on the corresponding read bit line 42.

The latch 444 of each bit line amplifier unit 412 is electrically connected to the drain of the corresponding transistor 440. The latch 444 includes an output that carries the "ampout" signal that is the output of the bit line amplifier unit 412 and is typically electrically connected to the input of a logic decoder, such as the logic decoder 22. The latch 444 is configured to generate an electrical output based on a comparison of the global reference voltage output by the global voltage source 408 and a voltage on the corresponding read bit line 42. In particular, the latch 444 is configured to change from a first latch state to a second latch state based on a voltage on the read bit line 42 as established by the hold voltage and the reference voltage. In one embodiment, the latches 444 are reset to the first latch state at the beginning of a read cycle of the memory array 400. If the latches 444 detect a certain logical value (based on the comparison of the hold voltage to the reference voltage) then the latch 444 changes to the second latch state. For example, in one embodiment, if the bit cell 416 stores a logical "0," then the latch 444 stays in the first latch state during the read cycle and if the bit cell 416 stores a logical "1," then the latch 444 changes to the second latch state.

The controller 420 is electrically connected to the latches 444 and the gates of the current stop transistors 436. The controller 420 is provided as any desired type of electronic controller or processor. The controller 420 performs at least two functions, first the controller 420 is configured to cause the latches 444 to enter a first latch state at a beginning of a memory array read cycle. Thus, the controller 420 "resets" the latches 444 at the beginning of the read cycle. Second, the controller 420 enables the bit line amplifier units 412 to draw electrical current from the global voltage source 408 only during a sensing time period extending from a beginning of the read cycle to a time when the corresponding latch 444 changes to the second latch state. For example, in one embodiment, the controller 420 asserts the gates of the current stop transistors 436 to enable current draw by the bit line amplifier units 412 from the global voltage source 408.

The controller 420 detects which, if any, of the latches 444 that have transitioned to the second latch state (thereby ending the sensing time period) and deasserts the gates of the transistors 436 associated with the transitioned latches 444 to prevent those corresponding bit line amplifiers 412 from drawing current from the global voltage source 408. Thus, controller 420 is configured (i) to enable the bit line amplifier units 412 to draw current from the global voltage source 408 by closing the current stop switches 436, and (ii) to prevent the bit line amplifier units 412 from drawing electrical current from the global voltage source 408 by opening the current stop switches 436.

As set forth above and with continued reference to FIG. 15, in one embodiment, the controller 420 is configured to cause the bit line amplifier units 412 to draw current from the global voltage source 408 during the sensing time period that occurs when the is latch 444 is activated to detect a change in voltage on the read bit lines 42. The bit line amplifier unit 412 is enabled when the istop signal is asserted (LO) on the transistor 436 and is left on until a transition on the read bit line 42 has been sensed by the latch 444, or in the case of logic 0, a read bit line 42 transition has not been sensed by the latch 444. In some examples, the current in the bit line amplifier unit 412 has a very brief transitional current to switch the latch 444. Otherwise, the static current drawn by the bit line amplifier unit 412 switches between zero and a value that is more than a decade less than ibias. In one embodiment, the global voltage source 408 remains active throughout the read operation, and the amplifier units 412 remain active only while waiting for a voltage transistor on the read bit line 42, without drawing a significant amount of electrical current. In this manner, the current stop switches 436 control the current drawn by the bit line amplifier units 412 in much the same way that the stop switch 162 (FIG. 4) controls the current drawn from the op amp 112 during the read operation. Both the stop switch 436 and the stop switch 162 enable current draw only until a voltage transition has been sensed on the read bit line 42, thereby reducing the electrical power consumed by the associated memory array.

The controller 420 is also electrically connected to the global voltage source 408 and is configured to control the magnitude of the global reference voltage that is supplied to each of the bit line amplifier units 412. Thus, the controller 420 is configured to simultaneously change the magnitude of the global reference voltage supplied to each bit line amplifier unit 412 by changing the output of the global voltage source 408. One advantage of the controller 420 being able to control the magnitude of the global reference voltage is that the controller 420 is configured to increase the global reference voltage above a predetermined level in response to an increase in system noise to prevent the system noise from undesirably influencing the voltage on the read bit line 42.

The memory array 400 also includes a precharge transistor 448 configured to selectively connect a precharge voltage to the read bit line 42.

Additional Disclosure Regarding Certain Inventive Embodiments

Conventional sense amps (not shown) exist for one-transistor-one-capacitor (1T1C) cells and for gain cells. In a 1T1C gain cell (not shown), the storage capacitor unloads its charge onto the bit line, raising or lowering the line voltage a small amount. During readout, the bit line voltage changes. Once the bit line has stabilized, the sense amp is activated. Various prior schemes use a separate timing pulse asserted just before the bit line event is expected to occur to activate the sense amplifier. For gain cells, such as the gain cell 12, the read bit line is pulled down. Once stabilization is reached, the sense amp 18 is activated. The sense amplifier 18 is deactivated while the bit line 42 is stabilized, because the sense amp 18 draws current off the read bit line 42 that might corrupt the reading. Stabilization of the bit line 42 requires waiting until a worst-case stabilizing time for the bit line 42.

In various embodiments disclosed herein, a sense amp 108 is used that can be left active rather than being activated at a selected time. This advantageously permits faster readout, since analog-to-digital conversion can begin sooner. Various aspects provide reduced static power consumption compared to prior schemes.

In some aspects, the bit line voltage is tested against a threshold (e.g., when bit line has fallen from 1 V to 0.8 V), e.g., a global threshold. In some examples, a reference is buffered with an op amp as described herein to provide the reference signal (e.g., 200 m V=1 V-0.8 V) to a group of sense amps. The threshold can be adjusted dynamically, e.g., by increasing the threshold when noise voltage increases. This is a capability that prior sense amps do not have. Various MDP constructs use op-amps to provide references. Each op-amp can consume, e.g., 1 μA, whenever reading. To reduce the number of op-amps, the array can be partitioned into domains.

FIG. 6 shows the memory array 200 and the domain 204. As used herein, the term "domain" refers to a group of bit cells 14 and sense amps 108. In any given domain, the sense amps 108 share a common reference voltage, e.g., provided by the op-amp 112. The illustrated example domain 204 has n rows of k columns each (n≥1, k≥1), and one sense amp 108 ("bit line amp") per column. The circled "X" symbol represents the stop switch 162 that is also shown in FIG. 4. In some aspects, exactly one row is read at a time. For example, one row in a domain 204 of n rows and k columns can be read at a time.

Using multiple domains 204 permits including more bit cells 14 in an array 200 than prior schemes that do not use multiple domains 204. For example, the op-amp 112 drives the capacitance on the sources of the M2 transistors of each bit cell 14 and on the line tying those sources together. The nearest bit cell 14 (e.g., row n−1, column 0) and the farthest bit cell 14 (e.g., row 0, column k−1) have different capacitances because of the respective lengths of the lines and numbers of sources between the op-amp 112 and each bit cell 14. The larger the memory array 200, the wider this variation. For any given technology and op-amp design, there is a maximum capacitance that the op-amp 112 can drive and meet timing requirements, limiting the size of an array 200. Domains 204 can be much smaller than a full memory array 200, so the capacitance to the farthest bit cell 14, and the capacitance variation between the nearest bit cell 14 and the farthest bit cell 14, can be lower in the domain 204 than in the array 200. Using domains 204 thus permits expanding the array 200 (by adding domains) without limitations due to the performance of a single op-amp 112.

FIG. 7A shows an example memory array 250 including m domains 204. The switch 162 can drive many different bit cells 14 in the same column of bit cells 14. The reference voltage/current is shared between the read bit lines 42. There can be, e.g., 16 domains 204, 50 domains 204, or any number of domains 204 in a given memory array 200. The demux 270 passes the op-amp 112 voltage to the currently-active domain 204 for readout. In a multidomain chip, one row of bit cells 14 per domain 204 can be read at a time, or one row of bit cells 14 per chip at a time. Various examples are used in systems using partitioned bit lines, e.g., a top half and a bottom half. For example, an op-amp or set of op-amps can be used for each of two halves of an array 250 (two domains 204), each domain 204 including, e.g., 250,000 bit cells 14 of BASE4 storage, for a total of 1 Mbit of memory.

Some aspects run in a pipelined fashion, pipelining loading the bit line amplifiers 108 or the latches 444 (FIG. 15) for row n with reading the latches for row n−1. In one example, reads are performed at 1 MHz, and the data are clocked out of the latches at 60 MHz. One row can include, e.g., 64 8-bit words. Some aspects include a ping-pong between two domains 204.

FIG. 15 shows an example global sense amplifier assembly 406 that includes global voltage source 408 and bit line amplifier units 412. Various aspects herein use improved sense amps that include a modified differential pair. The modified differential pair in the example of FIG. 15 includes transistors 428 and 440. The modified differential pair is used in the bit cell 416 and the bit line amplifier unit 412 to reduce static power. The bit line amplifier unit 412 is enabled when the istop signal is asserted (LO) on the transistor 436 and is left on until a transition on the read bit line 42 has been sensed by the latch 444, or in the case of logic 0, a read bit line 42 transition has not been sensed by the latch 444.

A simplified schematic of multiple bit line amplifier units 412 operating in parallel is given in FIG. 15. A global bit line reference amplifier 408 is depicted driving multiple bit line amplifiers units 412. Assume current with value ibias is flowing in transistor 428. An example value for this current is 100 nA. An example voltage value of vddr is 0.9 V. There are four different states in the operating conditions for the memory array 400.

The precharge condition is STATE 0. The pc_n input signal is LO and the read bit line 42 is clamped to or otherwise held substantially at vddr (read supply voltage) with the transistor 448. The static current in the bit line amplifier unit 412 is zero because the transistor 436 is off.

The read process of the memory array 400 begins with STATE 1 and occurs when the pc_n signal is deasserted HI. The read bit line 42 is floating. In this time period, the latch 444 is initialized internally so as to force the state of the latch 444 output, ampout, to be LO. The static current of the bit line amplifier unit 412 is zero because the transistor 436 is kept off with the signal istop.

The next defined condition is STATE 2 beginning when the istop signal is deasserted LO. There are two possible options. If the active bit cell 416 that is tied to the read bit line 42 has a logic 0 stored, STATE 2A exists, and the read bit line 42 will stay floating at vddr. The transistor 440 forms a modified differential pair with 428. The voltage tied to the gate of transistor 428 is set 150 mV lower than vddr and the current in the amplifier 408 is the sub-threshold current that is flowing in transistor 428 and its value is more than a decade lower than that of ibias.

For the case of logic 1 in the active bit cell 416, STATE 2B exists and the voltage on the read bit line 42 falls with respect to vddr. The switching threshold for the bit line amplifier unit 412 is set with the reference bl_ref. When the read bit line 42 has a lower value than the reference bl_ref, higher current will flow in transistor 440 causing the state of the latch 444 output to switch from LO to HI.

The next state is STATE 3, the current-stop state. The signal istop is derived from the system current stop logic (i.e. the controller 420), and is triggered from the ampout signal transitioning from LO to HI.

In some examples, the current in the bit line amplifier unit 412 has a very brief transitional current to switch the latch 444. Otherwise, the static current switches between zero and a value that is more than a decade less than ibias. The amplifier units 412 can thus remain active while waiting for a voltage transistor on the read bit line 42. Also, the amplitude of the voltage transitions on the read bit line 42 can be globally set by adjusting the bit line reference voltage bl_ref at the global voltage source 408.

The pre-determined threshold voltage for the bit line amplifier units 412 can be adjusted globally. If the system noise is too high for a given threshold, the allowable voltage transitions on the read bit line 42 are increased by adjusting the switched threshold of the bit line amplifier units 412, e.g., higher than 150 mV. Hence, the power dissipation is traded off with noise performance. There is not an inherent limit in the noise performance as occurs in other memory architectures.

Still referring to FIG. 15, the global reference voltage is provided to transistor 436, which is controlled by the istop signal from the controller 420. The leading edge of the istop control pulse that closes the transistor 436 is the read pulse. The voltage on the read bit line 42 will drop when reading a '1' bit but not when reading a '0' bit. After the leading edge, when the bit line amplifier unit 412 triggers in response to a voltage fall of a magnitude greater than the threshold voltage, the controller 420 deasserts the istop signal which sends transistor 436 into cutoff.

Transistors 448 are the precharge transistors. Vddr can be, e.g., 1 V or any other suitable value.

Transistors 440 turn on when the voltage on the read bit line 42 has fallen far enough. For example, the read bit line 42 can be at 1 V and the transistor 428 is set to 850 mV (150 mV threshold). Ibias current flows, e.g., 10 nA. The static current in transistor 440 will be significantly less than 10 nA, e.g., <1 nA—nearly in cutoff. When the voltage on the read bit line 42 falls, the current will gradually increase due to decreasing Vgs, until Ibias flows in transistor 440 when the bit line is at 850 mV. As the voltage on the read bit line 42 continues to drop, the current in transistor 440 increases above Ibias. The 444 latch includes a current comparator that triggers when the input current is above Ibias. The latch 444 can include a current conveyor and a current comparator. The latch 444 can include a current-steering architecture.

The memory timing is selected to determine how much time is permitted for reading. The outputs of the latches 444 at a time determined by, e.g., a state machine or timer are sampled and held to provide the digital outputs.

Various aspects of the global voltage source 408 and the bit line amplifier units 412 include a modified differential pair. This reduces time and variability of time for readout. However, various aspects herein are generally insensitive to threshold-voltage variations. This permits reading using a more consistent timing cycle.

In various aspects, the reference voltage output by the global voltage source 408 is adjusted. For example, the storage cap 50 (FIG. 1B) can hold voltages between 1.3 V and 0.4 V. This voltage range can be divided, e.g., into evenly spaced bins demarcated by voltage levels (e.g., levels of 0.4 V, 0.625 V, 0.85 V, 1.075 V, corresponding to voltage drops from 1.3 V of 0.9 V, 0.675 V, 0.45 V, 0.225 V respectively). Each individual level can be tested individually. The read bit line 42 will drop in voltage more or more quickly when reading higher stored voltages than when reading lower stored voltages.

Figure 16:
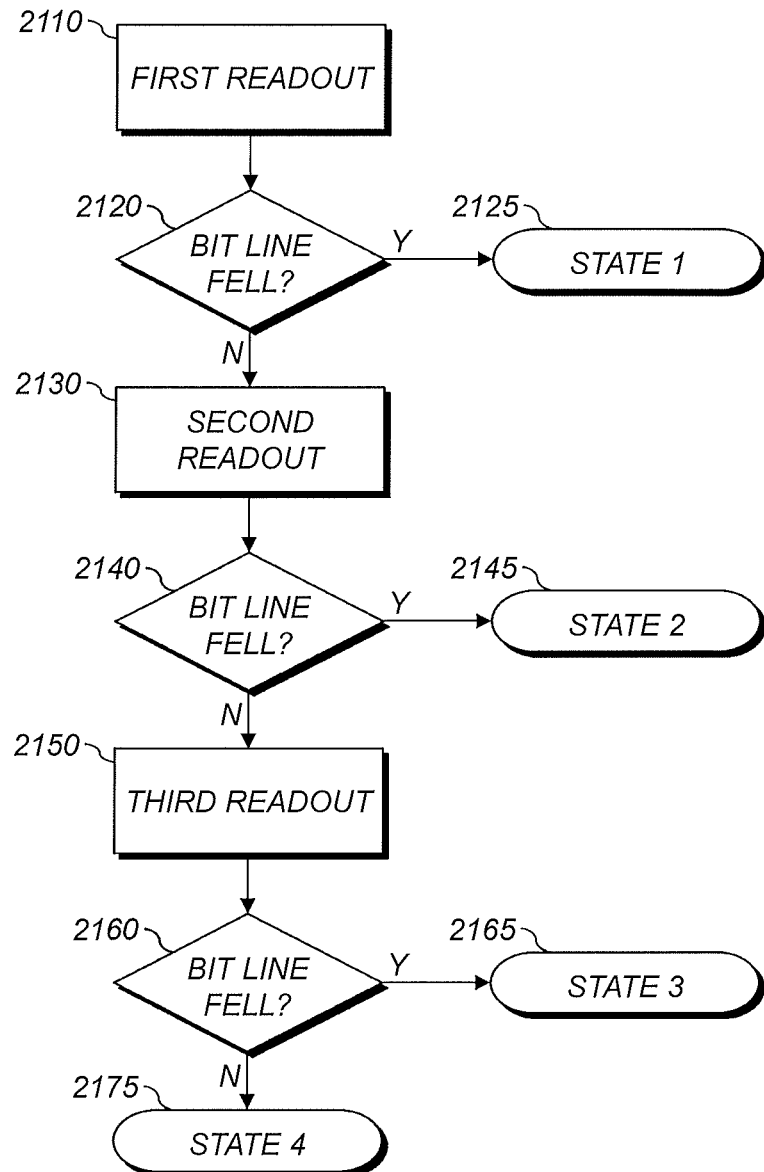
FIG. 16 is a flowchart illustrating a method of reading a stored valve of an MDP bit cell in BASE4 mode.

FIG. 16 shows an example method of reading a BASE4 bit cell (such as bit cell 14) according to various aspects. The steps can be performed in any order except when otherwise specified, or when data from an earlier step is used in a later step. In at least one example, processing begins with step 2110. It should be noted, however, that other components can be used; that is, exemplary method(s) shown in FIG. 16 are not limited to being carried out by the identified components.

In a first readout 2110, the reference voltage can be, e.g., ≥1.1 V and <1.3 V, or, e.g. 1.075 V. If the voltage on the read bit line 42 falls, the stored data was a first state 2125. If the voltage on the read bit line 42 does not fall, the readout can be repeated (2130) with a different threshold, e.g., 0.85 V. If the voltage on the bit line 42 falls, the stored data was a second state 2145. If the voltage on the read bit line 42 does not fall, the readout can be repeated (2150) with a different threshold, e.g., 0.625 V. If the voltage on the read bit line 42 falls, the stored data was a third state 2165. Otherwise, the stored data was a fourth state 2175. The read bit line 42 stays precharged in some aspects while multiple levels are tested. In some examples, the first state corresponds to the bit pattern 11, the second state to 10, the third state to 01, and the fourth state to 00, but any assignment of bit patterns to states can be used.

Any number of readouts (e.g., 2110) and determinations of whether the voltage on the read bit line 42 fell (e.g., 2120) can be used with respective thresholds to provide a selected number of bits or values stored in a memory cell (e.g. bit cell 416). In some examples, the number of values is an integer power of 2 (e.g., 2, 4, 8, 16, . . . ). In some examples, the number of values is not an integer power of 2 (e.g., 3, 5, 13, 21, 34, 55, . . . ). In some examples, the different thresholds are evenly spaced, e.g., in a linear or logarithmic space. In some examples, at least one of the thresholds is spaced apart from two adjacent thresholds by respective, different voltages.

In some examples, control signals such as precharge and read can be held asserted while two or more successive readouts (e.g., 2110, 2130, 2150) take place. In some examples, such control signals can be asserted for a given readout and deasserted before the next readout begins. Any combination of these can be used.

In various aspects, the pre-determined threshold for the bit line amplifier unit 412 is adjusted globally. Hence, the power dissipation can be traded off with noise. In various aspects, the static power for each bit line amplifier unit 412 can be kept low, on the order of nanoamps while it is waiting to make a decision about the state of the read bit line.

Referring back to FIG. 7A, in multilevel (e.g., BASE4) memory array 250, the reference voltage can be stepped for readout purposes. In some examples, a single op-amp 112 is successively adjusted to three different levels, e.g., before step 2110, between steps 2120 and 2130, and between steps 2140 and 2150, all FIG. 16. In some examples, e.g., to improve readout time, multiple op amps 112 (FIG. 7B) can be used, one for each of the three (or n-1 for base n) levels. As shown in FIG. 7B, the demux 270 can have as input the output of a mux 274 selecting from one of a plurality of op-amps 112. This permits operating without incurring the time required for the op-amp 112 of FIG. 7A to slew between voltage levels. Some configurations use one op-amp 112 and a read time <10 kHz in BASE4. Some aspects have similar readout time to one-transistor (1T) cells.

In various aspects, since the bit line amplifier 108 can be kept active while waiting for the state of the read bit line 42 to change or not, the timing performance can be superior to prior memory sense amplifiers. The actual event triggers the resulting action. This provides superior performance over prior schemes in which a separate event is established from a dummy timing generator to trigger the sense amp.

In view of the foregoing, various aspects provide technical effects including faster readout of bits, the ability to store more than one bit of information in a memory cell, or reduced power consumption of the sense amplifier.

Figure 17:
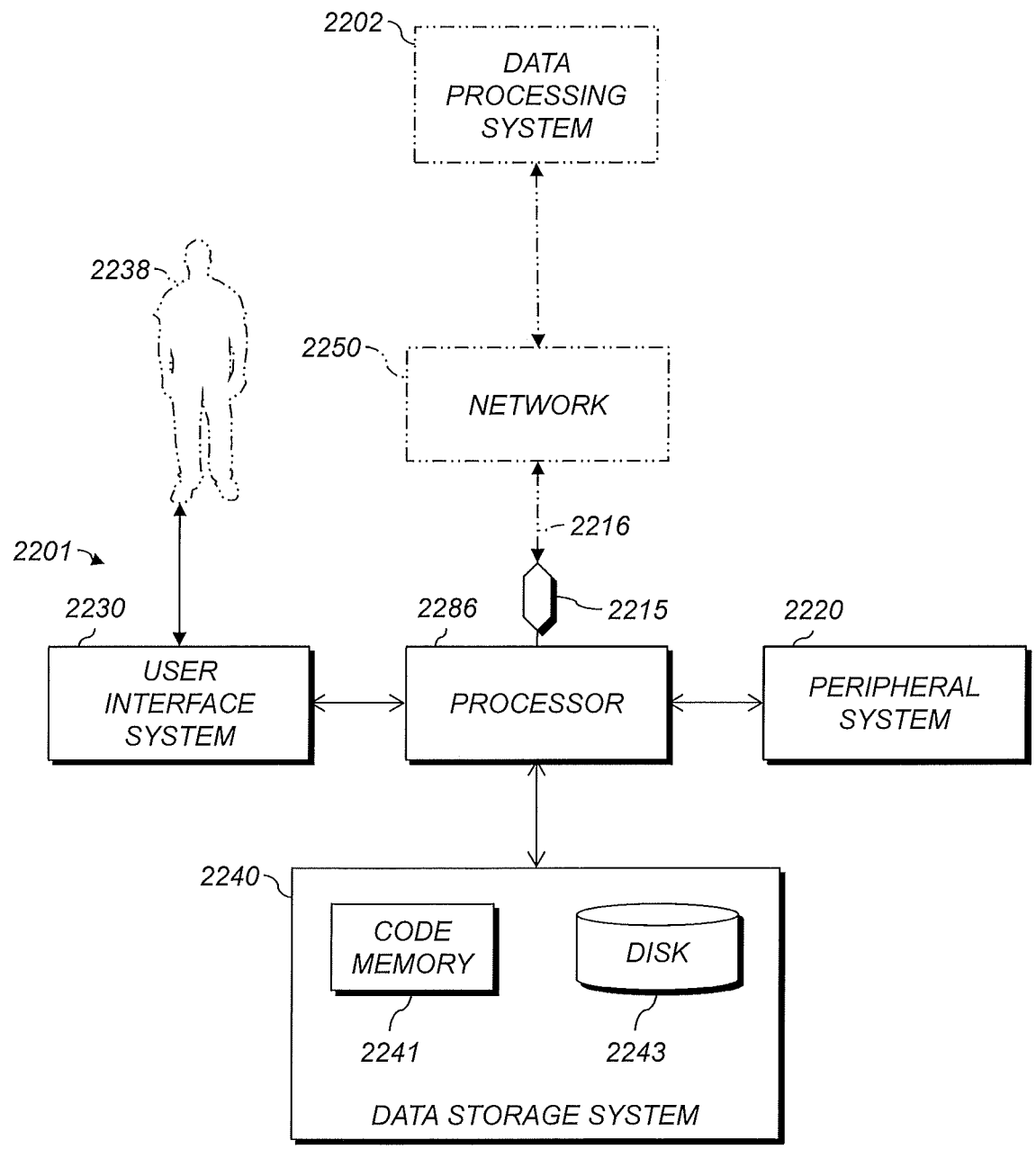
FIG. 17 is a block diagram of a system configured for use with a memory array as disclosed herein.

FIG. 17 is a high-level diagram showing the components of an exemplary data processing system 2201 for analyzing data and performing other analyses described herein, and related components. The system 2201 includes a processor 2286, a peripheral system 2220, a user interface system 2230, and a data storage system 2240. The peripheral system 2220, the user interface system 2230 and the data storage system 2240 are communicatively connected to the processor 2286. Processor 2286 can be communicatively connected to network 2250 (shown in phantom), e.g., the Internet or a leased line, as discussed below. Processor 2286, and other processing devices described herein, can each include one or more microprocessors, microcontrollers, field-programmable gate arrays (FPGAs), application-specific integrated circuits (ASICs), programmable logic devices (PLDs), programmable logic arrays (PLAs), programmable array logic devices (pALs), or digital signal processors (DSPs). Processor 2286 or code memory 2241 can include memory cells or arrays as described above, e.g., as shown in FIG. 16.

Processor 2286 can implement processes of various aspects described herein. For example, processor 2286 can operate one or more sense amp(s) and bit-/word-line selectors to read out BASE2 or BASEn (n>2) memory, e.g., as described above with reference to FIG. 16. Processor 2286 can adjust op-amp reference voltages or control op-amp mux selector inputs, e.g., as discussed above with reference to FIG. 7B. Processor 2286 and related components can, e.g., carry out processes for memory readout, memory write, and (if necessary for a particular memory) memory refresh.

Processor 2286 can be or include one or more device(s) for automatically operating on data, e.g., a central processing unit (CPU), microcontroller (MCU), desktop computer, laptop computer, mainframe computer, personal digital assistant, digital camera, cellular phone, smartphone, or any other device for processing data, managing data, or handling data, whether implemented with electrical, magnetic, optical, biological components, or otherwise. Processor 2286 can include Harvard-architecture components, modified-Harvard-architecture components, or Von-Neumann-architecture components. Memories onboard processor 2286, e.g., L1 cache memories or register files, can include bit cells and arrays as described above.

The phrase "communicatively connected" includes any type of connection, wired or wireless, for communicating data between devices or processors. These devices or processors can be located in physical proximity or not. For example, subsystems such as peripheral system 2220, user interface system 2230, and data storage system 2240 are shown separately from the data processing system 2286 but can be stored completely or partially within the data processing system 2286.

The peripheral system 2220 can include or be communicatively connected with one or more devices configured or otherwise adapted to provide digital content records to the processor 2286 or to take action in response to processor 2286. For example, the peripheral system 2220 can include digital still cameras, digital video cameras, cellular phones, or other data processors. The processor 2286, upon receipt of digital content records from a device in the peripheral system 2220, can store such digital content records in the data storage system 2240.

The user interface system 2230 can convey information in either direction, or in both directions, between a user 2238 and the processor 2286 or other components of system 2201. The user interface system 2230 can include a mouse, a keyboard, another computer (connected, e.g., via a network or a null-modem cable), or any device or combination of devices from which data is input to the processor 2286. The user interface system 2230 also can include a display device, a processor-accessible memory, or any device or combination of devices to which data is output by the processor 2286. The user interface system 2230 and the data storage system 2240 can share a processor-accessible memory.

In various aspects, processor 2286 includes or is connected to communication interface 2215 that is coupled via network link 2216 (shown in phantom) to network 2250. For e example, communication interface 2215 can include an integrated services digital network (ISDN) terminal adapter or a modem to communicate data via a telephone line; a network interface to communicate data via a local-area network (LAN), e.g., an Ethernet LAN, or wide area network (WAN); or a radio to communicate data via a wireless link, e.g., WI-FI or GSM. Communication interface 2215 sends and receives electrical, electromagnetic or optical signals that carry digital or analog data streams representing various types of information across network link 2216 to network 2250. Network link 2216 can be connected to network 2250 via a switch, gateway, hub, router, or other networking device.

In various aspects, system 2201 can communicate, e.g., via network 2250, with a data processing system 2202, which can include the same types of components as system 2201 but is not required to be identical thereto. Systems 2201, 2202 are communicatively connected via the network 2250.

Processor 2286 can send messages and receive data, including program code, through network 2250, network link 2216 and communication interface 2215. For example, a server can store requested code for an application program (e.g., a JAVA applet) on a tangible non-volatile computer-readable storage medium to which it is connected. The server can retrieve the code from the medium and transmit it through network 2250 to communication interface 2215. The received code can be executed by processor 2286 as it is received, or stored in data storage system 2240 for later execution.

Data storage system 2240 can include or be communicatively connected with one or more processor-accessible memories configured or otherwise adapted to store information. The memories can be, e.g., within a chassis or as parts of a distributed system. The phrase "processor-accessible memory" is intended to include any data storage device to or from which processor 2286 can transfer data (using appropriate components of peripheral system 2220), whether volatile or nonvolatile; removable or fixed; electronic, magnetic, optical, chemical, mechanical, or otherwise. Exemplary processor-accessible memories include but are not limited to: registers, floppy disks, hard disks, tapes, bar codes, Compact Discs, DVDs, read-only memories (ROM), erasable programmable read-only memories (EPROM, EEPROM, or Flash), and random-access memories (RAMs), such as RAMs illustrated herein, e.g., in FIG. 15. One of the processor-accessible memories in the data storage system 2240 can be a tangible nontransitory computer-readable storage medium, i.e., a non-transitory device or article of manufacture that participates in storing instructions that can be provided to processor 2286 for execution.

In an example, data storage system 2240 includes code memory 2241, e.g., a RAM, and disk 2243, e.g., a tangible computer-readable rotational storage device or medium such as a hard drive. Computer program instructions are read into code memory 2241 from disk 2243. Processor 2286 then executes one or more sequences of the computer program instructions loaded into code memory 2241, as a result performing process steps described herein. In this way, processor 2286 carries out a computer implemented process. For example, steps of methods described herein, blocks of the flowchart illustrations or block diagrams herein, and combinations of those, can be implemented by computer program instructions. Code memory 2241 can also store data, or can store only code.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

Furthermore, various aspects herein, e.g., of memory-readout techniques such as those in FIG. 16, may be embodied as computer program products including computer readable program code ("program code") stored on a computer readable medium, e.g., a tangible nontransitory computer storage medium or a communication medium. A computer storage medium can include tangible storage units such as volatile memory, nonvolatile memory, or other persistent or auxiliary computer storage media, removable and non-removable computer storage media implemented in any method or technology for storage of information such as computer readable instructions, data structures, program modules, or other data. A computer storage medium can be manufactured as is conventional for such articles, e.g., by pressing a CD-ROM or electronically writing data into a Flash memory. In contrast to computer storage media, communication media may embody computer-readable instructions, data structures, program modules, or other data in a modulated data signal, such as a carrier wave or other transmission mechanism. As defined herein, computer storage media do not include communication media. That is, computer storage media do not include communications media consisting solely of a modulated data signal, a carrier wave, or a propagated signal, per se.

The program code includes computer program instructions that can be loaded into processor 2286 (and possibly also other processors), and that, when loaded into processor 2286, cause functions, acts, or operational steps of various aspects herein to be performed by processor 2286 (or other processor). Computer program code for carrying out operations for various aspects described herein may be written in any combination of one or more programming language(s), and can be loaded from disk 2243 into code memory 2241 for execution. The program code may execute, e.g., entirely on processor 2286, partly on processor 2286 and partly on a remote computer connected to network 2250, or entirely on the remote computer.

Figure 18:
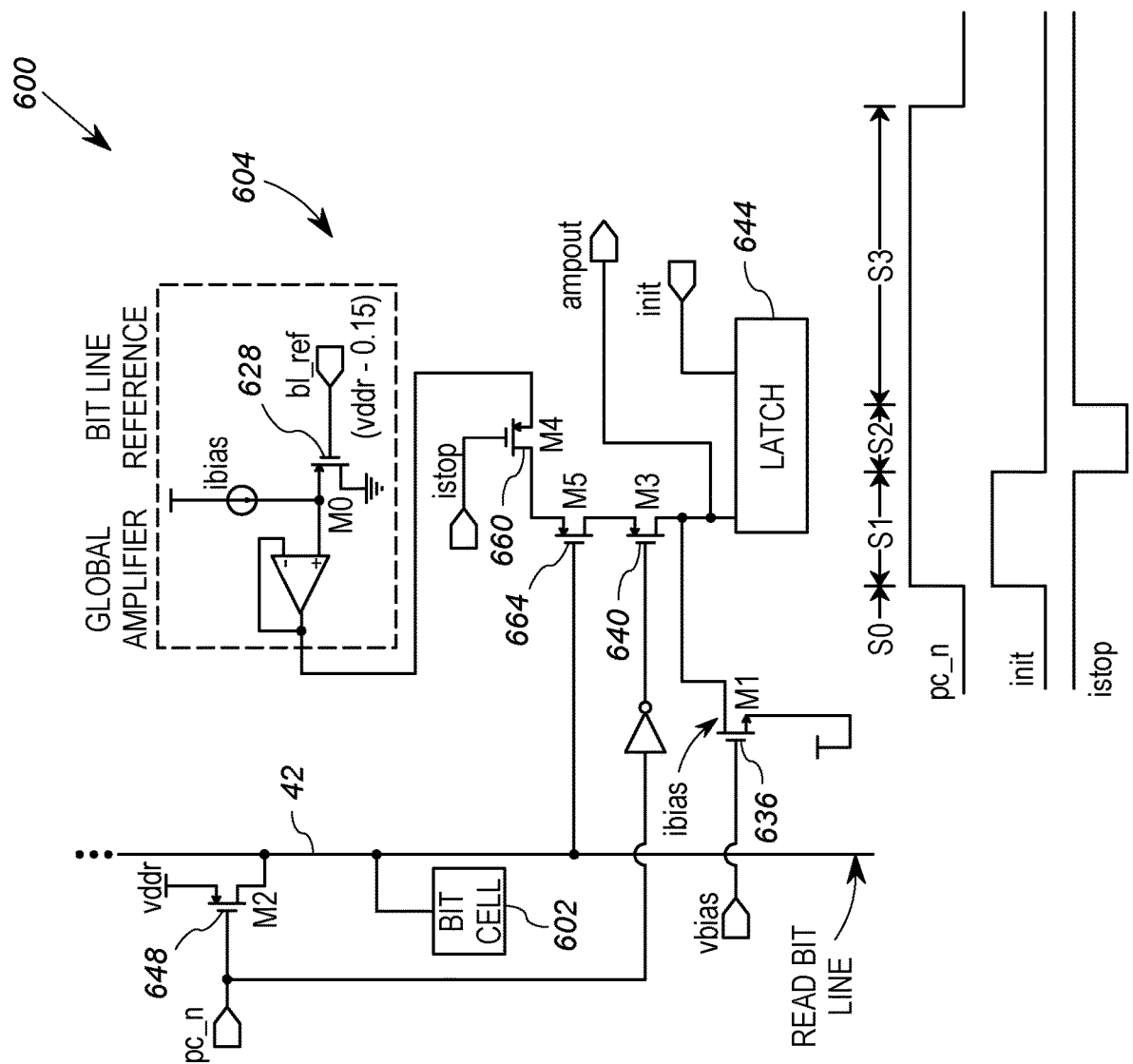
FIG. 18 is an exemplary schematic of a memory array including a bit line amplifier assembly.

FIG. 18 shows a schematic of a memory array 600 including a bit cell 602 and an example bit line amplifier assembly 604 configured for the modified differential pair principle. The modified differential pair design principle used in the memory bit cell 14 (FIG. 1B) is also applied to the bit line amplifier assembly 604 to reduce static power.

The bit line amplifier assembly 604 is enabled when the istop signal is asserted and left on until a transition on the read bit line has been sensed, or in the case of logic 0, a read bit line 42 transition has not been sensed.

Current with value ibias is flowing in transistor 628 and transistor 636. This example uses a voltage value of 0.9 V for vddr and 50 nA for ibias. There are four different states in the operating conditions for the memory array 600. We define the precharge condition as STATE 0. The pc_n input signal is LO and the read bit line 42 is clamped to vddr with the transistor 648. The static current in the bit line amplifier 604 is zero because the transistor 640 is off.

The read process begins with STATE 1 and occurs when the pc_n signal is deasserted HI. The read bit line 42 is floating. The init signal is asserted and forces the state of the output of the latch 644, ampout, to be LO. The static current of the bit line amplifier 604 is still zero because the transistor 660 is kept off with the signal istop.

The next defined condition is STATE 2 beginning when the stop signal is deasserted LO, There are two possible options. If the active bit cell 602 has a logic 0 stored, STATE 2A exists, and the read bit line 42 will stay floating at vddr. The transistor 664 forms a modified differential pair with 628. The voltage tied to the gate of 628 is set 150 mV lower than vddr, transistor 636 is ohmic, and the current in the amplifier 604 is the sub-threshold current that flowing in transistor 664 and its value is more than a decade lower than that of ibias.

For the case of logic 1 in the active bit cell 602 STATE 2B exists, and the voltage on the read bit line 42 voltage will be falling. When the read bit line 42 has a lower voltage than the reference voltage bl_ref, higher current will flow in transistor 664 causing the state of the latch 644 to switch from LO to HI. After the latch 644 is switched, the static current will then be substantially equal to ibias.

The next state is STATE 3, the current stop state. The signal istop is derived from the system current stop logic being triggered from the ampout signal transitioning from LO to HI.

The current in the bit line amplifier 604 has a very brief transitional current to switch the latch 644. After the latch 644 has switched states, the amplifier 604 spends a short time with value of ibias between the time that the read bit line 42 transition is sensed and istop is asserted. Otherwise, the static current switches between zero and a value that is more than a decade less than ibias. It is reasonable to have the amplifiers 604 active while they are waiting for a transition on the read bit line 42. Also, the amplitude of the voltage transitions on the read bit line 42 is globally set by adjusting the bit line reference voltage bl_ref.

The pre-determined threshold for the bit line amplifier 604 is adjusted globally. If the system noise is too high, the allowable read bit line transitions are increased by adjusting the witched threshold of the bit line amplifiers even higher than the 150 mV that is expected to be needed. Hence, the power dissipation can be traded off with noise performance. There is not an inherent limit in the noise performance as occurs in other memory architectures.

Simulation and Test Results of Inventive Aspects of the Disclosure

The architecture of the memory arrays 100, 150, 200, 300, 600 described herein uses a logic-compatible CMOS process particularly suitable for embedded applications. The differential pair construct causes the read and refresh power to be independent of any process parameter including the within die threshold voltage. The current stop feature keeps the read voltage transition low to further minimize read power. The bit cell 14 operates in both single bit BASE2 and multi-bit BASE4 modes. An expression for the read signal has been verified with bit cell simulations. The bit cell simulations also compare the performance impact of threshold voltage variance in this architecture with a standard gain cell. A DRAM bit cell array was fabricated in the XFab 180 nm CMOS process. Measured waveforms closely match theoretical results obtained from a system simulation. The silicon retention time was measured at room temperature and is greater than 150 ms in BASE2 mode and greater than 75 ms in BASE4 mode. 180 nm, 25° C. analysis predicts 0.8 μW/Mbit refresh power at 630 MHz, the lowest in the literature. Furthermore, the memory bit cell architecture disclosed herein has a refresh power delay product several times lower than any other published architecture.

An exemplary goal of the architecture disclosed herein is to optimize (i.e. reduce or eliminate) the unpredictable effect of threshold voltage variance. The second is to significantly reduce the voltage swing on the high capacitance read bit lines.

In standard gain cell architecture die-to-die read bit line voltage variance is caused by within-die threshold voltages and negatively affects the behavior of bit cell current, as is exhibited by the gain cell 12 of FIG. 1A. The architecture disclosed herein (see gain cell 14 of FIG. 1B) removes the effect of within-die threshold voltage by adding transistor M3. Transistor M3 forms a differential pair construct with transistor M2 in the gain cell 14, as shown in FIG. 1B. Since the within-die threshold voltage of the two transistors M2 and M3, are effectively equal within a specified tolerance, they cancel each other out. Thus the effect of within-die threshold voltage on bit cell current is removed within a specified tolerance. Consequently the problem of die-to-die bit line voltage variance is also removed and the predictability of bit cell current is greatly improved.

Operational amplifier 112 supplies the necessary current allowing multiple bit cells 14 to share the M3 reference transistor. The shared reference transistor M3, op amp 112, and read transistor M2 form a modified differential pair. The relationship between the two transistors M2 and M3 in FIG. 1B is described with Kirchhoff's Voltage Law. Applying the law, $$0 = v_{GS3} - v_{GS2} + v_{hold} - v_{ref} \quad (1)$$

where $v_{GS2}$ and $v_{GS3}$ are the gate to source voltages of M2 and M3 respectively, vhold is the voltage on the storage node and vref is the reference voltage. Using the equation for the saturation current for a transistor in weak inversion mode, $v_{GS}$ is defined as $$v_{GS} = n\varphi_t \ln(i_D) - n\varphi_t \ln(I_0) \quad (2)$$

where n=slope factor, $\varphi_t$=thermal voltage, $i_D$=drain current and $I_0$=saturation current and is defined as $$I_o = f(\mu, C_{OX}, \varphi_t, W/L, n, V_{th}) \quad (3)$$

where μ=mobility of electrons in the channel, $C_{OX}$=oxide capacitance per unit area, $\varphi_t$=thermal voltage, W/L=ratio of the transistor, n=slope factor, and $V_{th}$=threshold voltage. It is generally held that the within-die process parameters, the factors in equations (2) and (3), are considered equal within a specified tolerance for all transistors on any one die. Making the appropriate substitutions $v_{GS2} = v_{GS3}$ and the value of the threshold voltage of transistor M3 cancels the value of the threshold voltage of transistor M2.

To define the read signal, or change in bit line voltage, for the MDP consider, $$i = C_{BL} * dv/dt \quad (4)$$

Making the appropriate substitutions based on FIG. 1B and solving for $\Delta V_{BL}$ provides $$\Delta V_{BL} = (1/C_{BL}) \int [(i_{D2} - i_{D6})dt] \tag{5}$$

where $\Delta V_{BL}$ is the change in bit line voltage, $C_{BL}$ is the bit line capacitance, $i_{D2}$ is the drain current for M2, and $i_{D6}$ is the drain current for M6. A low ibias is used to operate transistor M6 as a current source in weak inversion mode so that its saturation voltage of $4*\varphi_t$, is approximately 100 mV. During the read operation of the MDP bit cell 14 the read bit line 42 is driven to an equilibrium condition where $i_{D2}$ equals $i_{D6}$ and the current discharging the bit line 42 capacitance is zero. Hence, the read bit line 42 voltage does not fall any further. And specifically, for the logic 0 condition, transistor M6 functions to strictly define and limit the change in voltage on the bit line 42 to its saturation voltage, approximately 100 mV. In the case of non-logic 0 on the storage node, equation (5) simplifies to $$\Delta V_{BL} = [(i_{D2} - ibias) * t_p]/C_{BL} \tag{6}$$

where $\Delta V_{BL} = vddr - V_{BLtsample}$, $V_{BLtsample}$ is the read voltage on the read bit line 42 at time $t_{sample}$, $i_{D2}$ is the storage node 120 transistor M2 current, ibias is the value of the p-channel current source transistor M6, $t_p$ is a portion of the time the read transistor M1 is held closed and $t_p = t_{sample} - t_{read}$, $t_{sample}$ is the point in time the read bit line 42 is measured, $t_{read}$ is the point in time the read transistor M1 goes closed, $t_{sample}$ occurs in time after $t_{read}$ and $C_{BL}$ is the value of the read bit line 42 parasitic capacitance.

By making appropriate substitutions of (1) and (2) into (6), the equation defining the MDP change in read bit line 42 voltage, or read signal, for non-logic 0 values is $$\Delta V_{BL} = \left\{ \exp\left(\frac{v_{hold} - v_{ref}}{n\varphi_t} + \ln(ibias)\right) - ibias \right\} * t_p / C_{BL} \tag{7}$$

where $v_{hold}$ is the voltage on the storage node 120, $v_{ref}$ is the voltage on the reference node, n=slope factor, $\varphi_t$=thermal voltage, ibias is the value of the p-channel current source transistor, $t_p$ is the time the read transistor M1 is held closed, and $C_{BL}$ is the value of the read bit line 42 parasitic capacitance. Threshold voltage is not a factor in this equation, thereby showing that the MDP construct of the memory array 100 cancels effects of the threshold voltages of transistors M2 and M3.

In BASE2 operation of the MDP bit cell 14, the stored voltage is one of two values, typically 0.5V or 0.8V. The timing diagrams are depicted in FIGS. 2A and 2B. Before the read process starts, transistor M5 pre-charges the read bit line. At the start of the read process, the precharge input 26 is deasserted and shortly after the read input 30 is asserted. The voltage on the read bit line 42 is then controlled with a current that is a function of the difference between the stored voltage 120 and the reference voltage as seen by the term vhold−vref in (7). If the stored voltage 120 is less than the reference voltage the read bit line 42 voltage will change no more than the value of the saturation voltage of transistor M6. But if the stored voltage 120 is greater than the reference voltage the read bit line 42 will be pulled down by the current in the storage transistor M2 until the topological limit is reached. Bit line amplifier 108 acts as a comparator and uses an appropriately low switching voltage to detect change, and so discerns the value represented by the voltage on the storage node.

Compared to the standard gain cell 12, the MDP bit cell 14, with its three transistors M1, M2, and 50 and shared reference transistor M3, has approximately the same storage capacity. However, the capacity of MDP bit cell 14 is nearly doubled when it is used in multi-bit mode having multiple logical bits in one bit cell 14. Accordingly, disclosed herein is an MDP implementation having one of four logical values in the bit cell 14, as two bits per cell or MDP BASE4. The modified differential pair eliminates the impact of the unpredictable threshold voltage variance on the required bit cell 14 voltage, and subsequently on the current controlling the read bit line 42. The insensitivity of the design to threshold voltage variance enables smaller voltage intervals between logic values and allows the MDP bit cell 14 to reliably accommodate four logical values.

The read operation of MDP BASE4 is similar to the MDP BASE2 operation. In BASE4 mode, instead of comparing the storage node 120 to a single reference value, it is compared to three reference values one at a time and one after another in a sequential order causing the read bit line to respond accordingly. The point in the sequence of comparisons that the read bit line 42 first drops beyond the switching voltage of the comparator indicates the value stored on the storage node 120. The bit line amplifier 108 acts as the comparator and outputs a digital indicator to the logic decoder 22. The logic decoder 22 uses the indicator, specifically the point in the sequence of comparisons the indicator is asserted, to discern the digital value represented by the voltage on the storage node. FIGS. 3A, 3B, 3C, and 3D illustrate MDP BASE4 timing diagrams.

The logic voltage levels for the MDP memory array 100 are generated from a stable source, such as a band gap, and are spaced as a function of the desired frequency of operation. MDP architecture facilitates the accurate reference voltages required for multi-bit operation. The reference voltage sources see high impedance at the gate of transistor M3 in FIG. 1B and are tapped from matched components relative to the logic level voltages. An analysis of MDP BASE4 voltage reference levels and threshold voltage mismatch described further herein.

The MDP principle is also applicable to the bit line amplifier 108 and greatly reduces static power. It is therefore reasonable to have the bit line amplifier 108 remain active while waiting for a read bit line transition. The MDP principle in the bit line amplifier 108 also increases noise performance by allowing global adjustment of the bit line amplifier 108 switching voltage.

The MDP bit cell 14 is more robust with respect to noise as compared to prior art bit cells. Specifically, the MDP bit cell 14 has a much larger read signal than 1T1C architectures because it is not subject to the attenuation caused by charge sharing between the bit cell 14 and the read bit line 42. The MDP bit cell 14 also has much larger read signal than some gain cell designs. Instead of a short and finite read signal with a small maximum, the MDP bit cell 14 has an ever increasing read signal.

As shown in FIG. 6, in one embodiment, the op amp 112 is selectively connectable to each column of bit cells 14. The bit cells 14 of each column have the sources of the transistor M2 tied together, such that the source of each transistor M2 is a common (i.e. the same) electrical point. As such, a group of columns of bit cells 14 is referred to as a Common Source Domain 204. FIG. 7A illustrates the op amp 112 shared among multiple Common Source Domains 204 by the demultiplexer 270.

The demultiplexer 270 limits the active number of bit cells 14 driven by the op amp 112 at any one time by enabling a reasonable capacitive load for the op amp 112. For example, assuming 0.6 fF of parasitic capacitance for each bit cell 14 and Common Source Domains 204 made up of 32 rows and 512 columns of bit cells 14, the op amp 112 drives a 10 pF capacitive load for the 16,384 bit cells 14 in the active Common Source Domain 204. A reasonable number of active and inactive bit cells 14 multiplexed with a single op amp 112 is around 250,000 bit cells 14.

In BASE2 for any frequency the output of the op amp 112 is constant. In BASE4 at low frequencies, the output of the op amp 112 is stepping between three levels. In some embodiments, in BASE4 at higher frequencies, the op amp 112 stepping quickly between three voltage levels uses a higher bias current than is desired. In such an embodiment, three op amps 112 are used (as shown in FIG. 7B) with constant outputs instead of one op amp 112 with a stepping output. In particular, each op amp 112 is outputs a respective one of the three reference voltage levels. The system of FIG. 7B, enables much more speed and eliminates any limits imposed by the finite step response of each op amp 112. Each of the three op amps 112 working in BASE4 mode can work with the same quiescent current as op amps 112 in the BASE2 mode.

The MDP bit cell 14 of FIG. 4 was simulated with Cadence® Spectre® software. The simulated performance of the MDP bit cell 14 was compared with simulated performance of a traditional gain cell (such as the gain cell 12 of FIG. 1A). The equations presented herein were verified by the MDP bit cell simulation, and the system simulation accurately modeled the MDP test structure. Based on this analysis the power for larger 1T, 3T gain cell, and MDP BASE2, and BASE4 memory systems was calculated. The results are divided into four sections: a comparison of analysis and bit cell simulation, a comparison of system simulation and silicon, estimated power usage for the four types of larger memory systems, and comparison to other state of the art eDRAM.

Graphs in FIGS. 8A and 8B plot the read signal of equation (7) compared to the MDP BASE2 and MDP BASE4 bit cell simulation read signal, and illustrate the bit cell simulations closely resemble the equation (7).

Figure 9B:
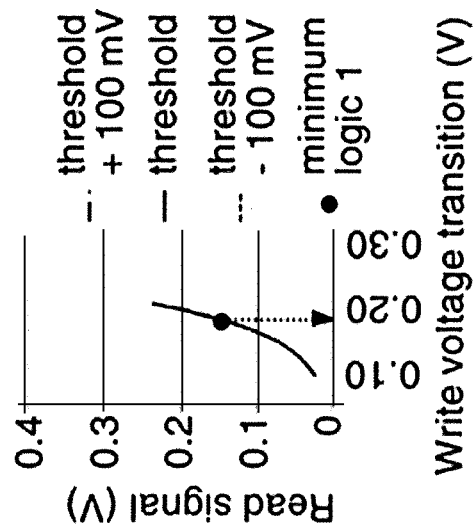
FIG. 9B is a graph of read signal voltage verses write voltage transition of an MDP bit cell in BASE2 mode.
Figure 9A:
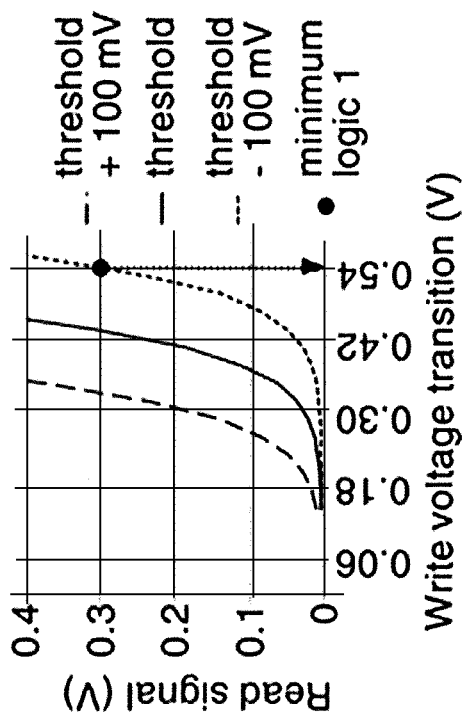
FIG. 9A is a graph of read signal voltage verses write voltage transition of the gain cell of FIG. 1A.

Read signal results from the first group of bit cell simulations are also graphed in FIGS. 9A and 9B for a standard gain cell 12 and a MDP BASE2 bit cell 14 across the same range of threshold variances was used in FIGS. 8A and 8B. FIGS. 9A and 9B illustrate the effect that threshold variance has on design and write power requirements. Specifically, FIG. 9A illustrates the impact threshold variance has on the logic 1 minimum voltage in a standard gain cell 12. With 0V threshold variance the gain cell logic 1 minimum needs to transition the write bit line about 0.44V to attain the desired read signal. But by accommodating a typical +100 mV die-to-die variance, the write bit line transition can be approximately 0.11V greater, or about 0.55V, to attain the required read signal. Thus in the gain cell 12 the die-to-die threshold variance requires the write bit line transition an additional 0.11V in order to accommodate variance. In this way the threshold variance has a direct impact on the gain cell 12 write and refresh power consumption.

In contrast to FIG. 9A, FIG. 9B shows the lack of effect the threshold variance has in an MDP bit cell 14. As expected from equation (1), the MDP graph shows no difference in the read signals over the range −100 mV to +100 mV of threshold variance. The three simulation curves are directly on top of each other. The logic 1 minimum in the MDP simulation requires only about a 0.18V write transition, regardless of the threshold variance. The write bit line transition necessary to change logic states is less than half compared to the gain cell 12. In this way, the MDP bit cell 14 uses approximately 50% less average power to write the bit cell.

Figures 10A, 10B:
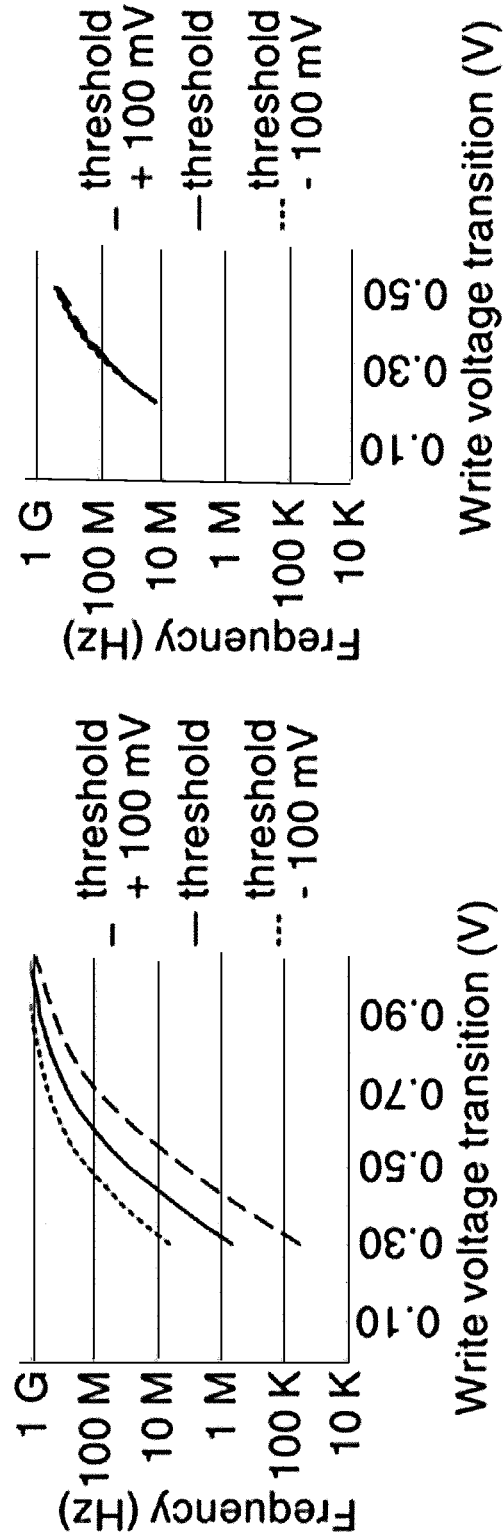
FIG. 10A is a graph of frequency verses write voltage transition of the gain cell of FIG. 1A.
FIG. 10B is a graph of frequency verses write voltage transition of an MDP bit cell in BASE2 mode.

In a second group of bit cell simulations the delay was measured and compared of the gain cell 12 to the MDP BASE2 bit cell 14. The elapsed time it took to reach the desired read signal was measured and so determined the operating frequency for any particular logic 1 minimum voltage. The simulation data graphed in FIGS. 10A and 10B for a standard gain cell 12 and for a MDP BASE2 bit cell 14 illustrate the effect threshold variance has on frequency and write power requirements. The change in bit line voltage necessary to write a logic 1 was graphed on the x axis to depict power requirements. FIGS. 10A and 10B illustrate the tradeoff between frequency and write power; as frequency increases the power necessary to write or refresh the bit cell increases. FIG. 10A for the gain cell 12 shows the read frequency falls off rapidly as write voltage transition lowers and varies sometimes as much as two orders of magnitude due to die-to-die threshold variance. FIG. 10B shows the frequency falls off only modestly for the MDP bit cell 14 as write transition voltage lowers and the threshold variation has virtually no effect. For example, operating at 100 MHz the gain cell 12 needs to transition about 0.72V on the write bit line while the MDP bit cell 14 need only transition about 0.34V and saves power accordingly.

Figure 11:
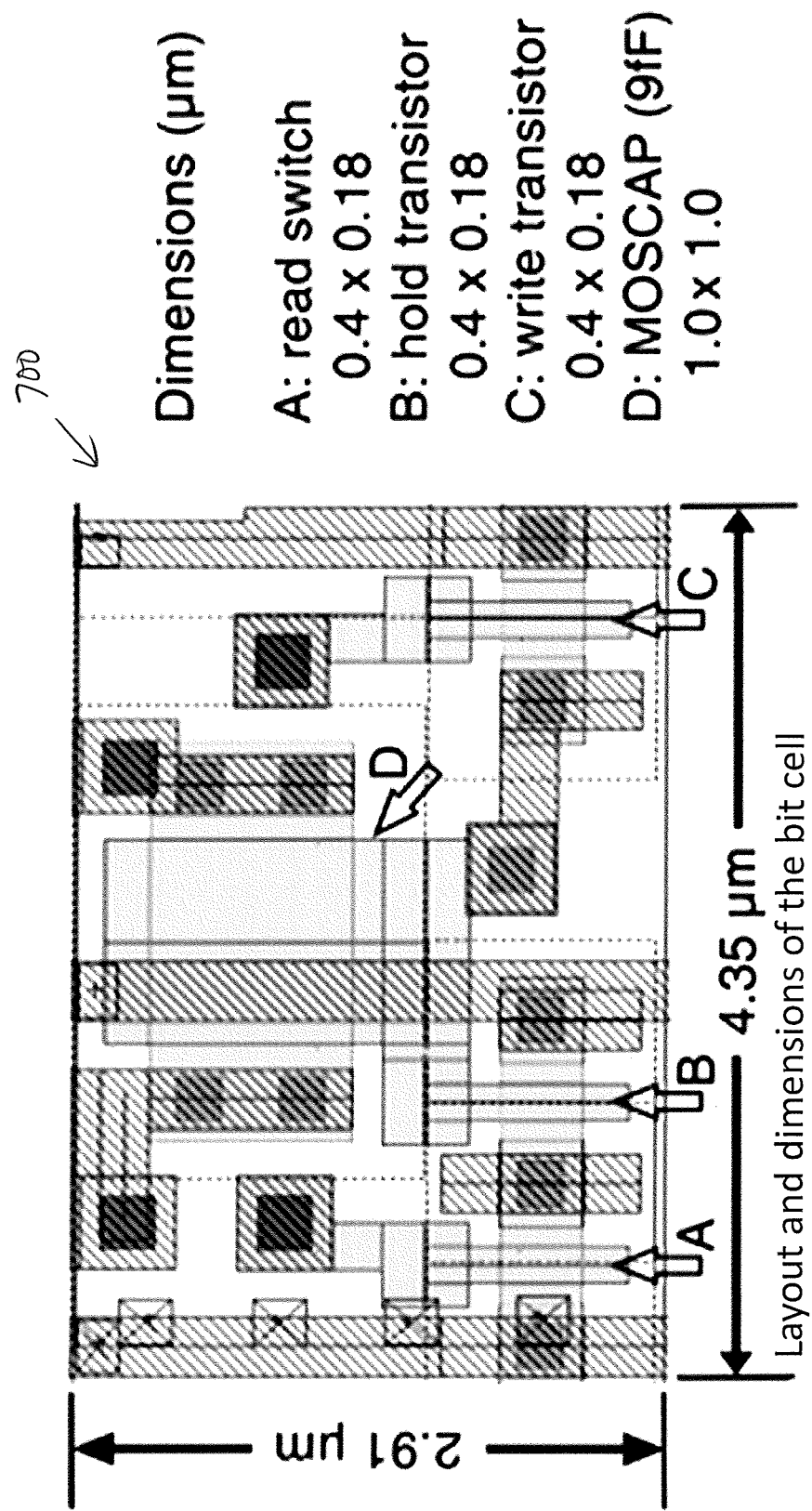
FIG. 11 is a block diagram plan view of the layout and dimensions of an exemplary MDP bit cell formed in silicon.

As shown in FIG. 11, an MDP memory test structure die 700 was fabricated in a 180 nm CMOS process to prove the modified differential pair construct with and without current stop. The silicon waveforms closely resemble the system simulation waveforms. Layout and bit cell dimensions are in FIG. 11. The test structure die 700 includes one MDP memory domain 204 with two columns and eight rows for a total of 16 bit cells 14. There is a row decoder 208 on the die 700, a reference transistor M3, and a transistor 162 for each column to implement the current stop switch.

Figure 12A:
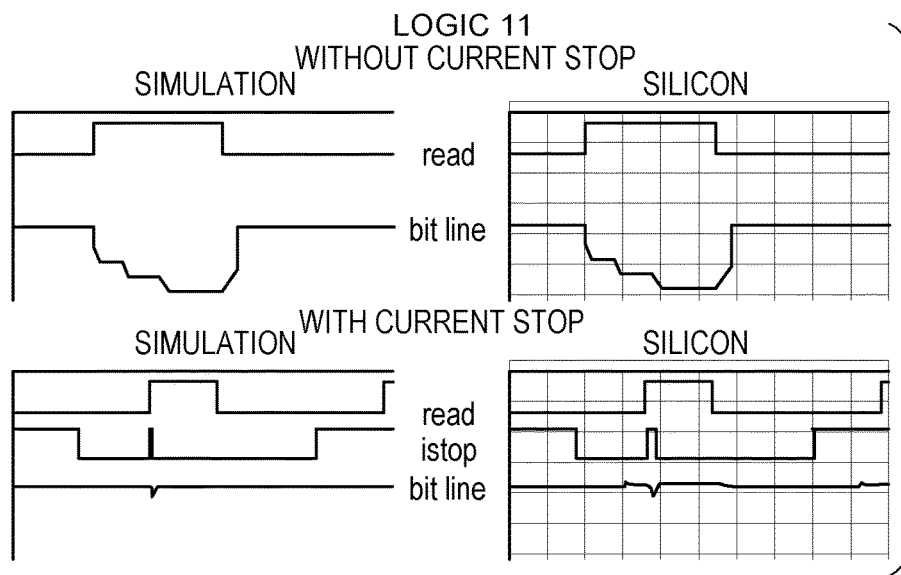
FIG. 12A includes graphs showing a comparison between a simulated MDP bit cell in BASE4 mode and an MDP bit cell in BASE4 mode manufactured according to the layout of FIG. 11 when the stored value corresponds to a logic "11;"
Figure 12B:
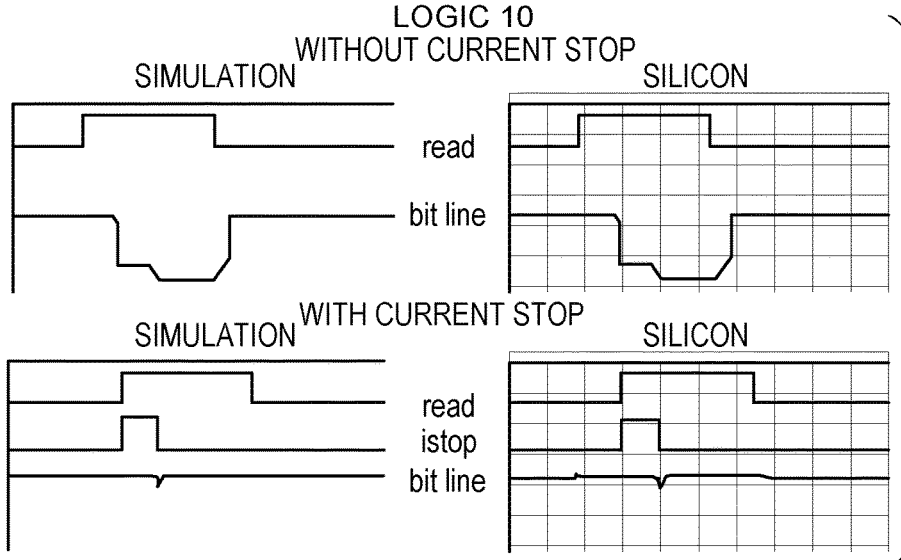
FIG. 12B includes graphs showing a comparison between a simulated MDP bit cell in BASE4 mode and an MDP bit cell in BASE4 mode manufactured according to the layout of FIG. 11 when the stored value corresponds to a logic "10;"
Figure 12C:
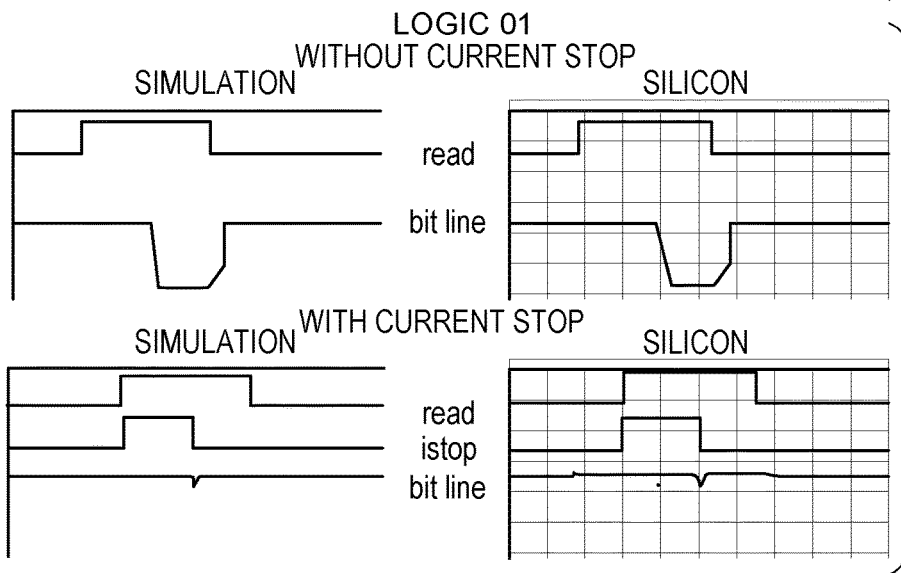
FIG. 12C includes graphs showing a comparison between a simulated MDP bit cell in BASE4 mode and an MDP bit cell in BASE4 mode manufactured according to the layout of FIG. 11 when the stored value corresponds to a logic "01;"
Figures 13A, 13B:
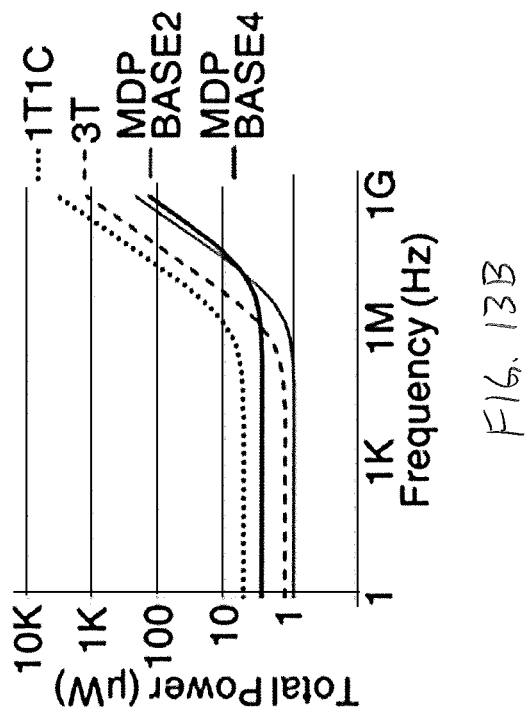
FIG. 13A is a table showing the pipelined total read power consumption of various bit cell embodiments.
FIG. 13B is a graph of pipelined total read power consumption verses frequency for the various bit cell embodiments of FIG. 13A.
Figures 14A, 14B:
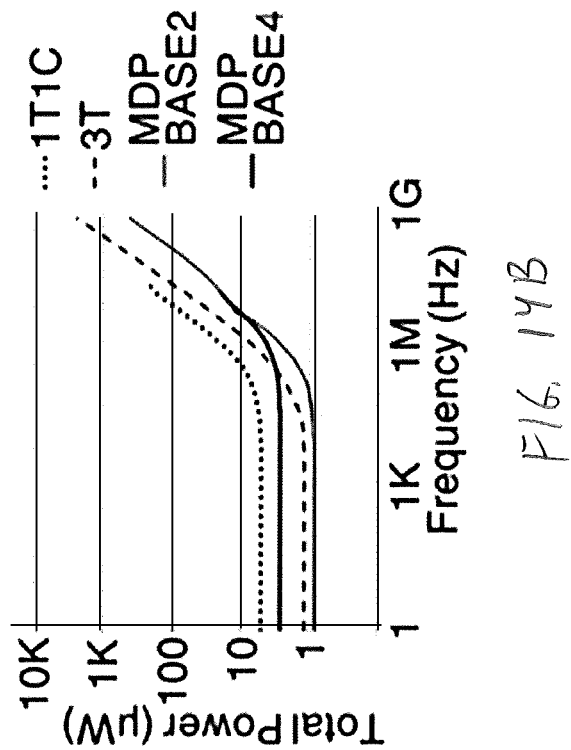
FIG. 14A is a table showing a random access total read power consumption of two bit cell embodiments.
FIG. 14B is a graph of the random access total read power consumption verses frequency for the two bit cell embodiments of FIG. 14A.

FIGS. 12A, 12B, and 12C contain both simulation waveforms and oscilloscope waveforms from the silicon tests grouped by logic value. Waveforms with and without the current stop assembly 154 are in the figure. The logic 00 case is trivial and is not included. The images without current stop clearly show the bit line voltage stepping down into the ohmic region and the images with current stop clearly show the impact of terminating the voltage change. All images show the silicon behavior matches the system simulation.

The worst case retention time is measured at room temperature in both BASE2 and BASE4 modes. A common voltage for each bit cell 14 is placed on the hold node 120 by writing to each of the bit cells 14. The time between the write and the reading of each cell 14 is gradually increased until the first read failure in any one of the cells 14 occurs. In this way, the worst case retention time is observed for the test structure. The worst case retention time was measured to be 150 ms for BASE2 and 75 ms for BASE4 at room temperature.

Using equation (11), the total power was calculated to read 16-bit words in both random access and pipelined reads for the 1T1C, 3T gain cell, MDP BASE2, and MDP BASE4 memory architectures. FIGS. 13A, 13B, 14A, and 14B summarize the results.

The insensitivity to the threshold voltage and reduced voltage swing on high capacitance bit lines greatly reduce the total power for the MDP memory compared to the 1T1C and the 3T gain cell. For example, an MDP BASE4 pipelined read of 16-bit words at 630 MHz uses 90 µW and the 1T1C pipelined read uses 2276 µW. At 630 MHz the MDP BASE4 power is 96% less than 1T1C. An MDP BASE2 random access read of 16 bit words at 630 MHz uses 419 µW and the 3T gain cell uses 2458 µW. At 630 MHz the MDP BASE2 power is 82% less than the 3T gain cell.

The memory arrays 100, 150, 200, 300, 600 disclosed herein successfully read and write BASE2 and BASE4 values to the bit cells 14 with no observable errors proving good noise margin even with large capacitive loads from the pads on the read bit lines 42. The measured silicon and the bit cell simulations prove the MDP memory concept and show that the assumptions made for the large memory system power calculations are reasonable.

The modified differential pair architecture eliminates the effect of die-to-die threshold voltage variance in the memory system. This has two major effects on system operation. It lowers write bit line voltage transition by more than 0.3V and enables four logic values per cell 14. The current stop feature has the additional effects of reducing read bit line 42 voltage transition down to 150 mV and reducing read access time accordingly. These reductions to the write and read bit line voltage transitions result in 90 µW active power for 16 bit pipelined reads in a BASE4 MDP at 630 MHz compared to 2276 µW in 1T1C, a power savings of 96%. The multi-bit capability results in increased capacity by up to 50% over standard 3T gain cells. The equation describing the read signal was verified with bit cell simulation and the system simulation was verified with test silicon. The retention time measurements of the test structure quantify the worst case bit cell leakage.

The invention is inclusive of combinations of the aspects described herein. References to "a particular aspect" (or "embodiment" or "version") and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. An electronic memory array including a plurality of read bit lines, comprising:
    a voltage source including a shared transistor configured to establish a reference voltage; and
    a plurality of bit line amplifier units electrically connected to said voltage source to receive said reference voltage, each bit line amplifier unit including a transistor having a gate that is electrically connected to a corresponding read bit line, each bit line amplifier unit further configured to generate an output based on a comparison of said reference voltage and a voltage on said corresponding read bit line,
    wherein said shared transistor of said voltage source and said corresponding transistor in each bit line amplifier unit are formed in said same circuit die,
    wherein a threshold voltage of said shared transistor cancels a threshold voltage of each of said corresponding transistors in said bit line amplifier units;
    and wherein,
    said voltage source includes an operational amplifier having a non-inverting input electrically connected to a drain of said shared transistor and an output electrically connected to each bit line amplifier unit,
    said operational amplifier and said shared transistor form a modified differential pair with each corresponding transistor of said bit line amplifier units;
    a first electrical current flows between a source and a drain of the shared transistor and establishes, at least in part, a magnitude of said reference voltage,
    a second electrical current flows between a source and a drain of the corresponding transistor of the bit line amplifier units, and
    a magnitude of the second electrical current is equal to a function of the difference between said reference voltage and said voltage on said corresponding read bit line.

2. The electronic memory array of claim 1, wherein each bit line amplifier unit further comprises:
    a current stop switch configured to enable said corresponding bit line amplifier unit to draw current from said voltage source when said current stop switch is in a closed state, and configured to prevent said corresponding bit line amplifier unit from drawing current from said voltage source when said current stop switch is in an open state.

* * * * *